(12) United States Patent
Lai

(10) Patent No.: US 9,559,113 B2
(45) Date of Patent: Jan. 31, 2017

(54) SSL/GSL GATE OXIDE IN 3D VERTICAL CHANNEL NAND

(71) Applicant: Macronix International Co., Ltd., Hsinchu (TW)

(72) Inventor: Erh-Kun Lai, Longjing Shiang (TW)

(73) Assignee: Macronix International Co., Ltd., Hsinchu (TW)

( * ) Notice: Subject to any disclaimer, the term of this patent is extended or adjusted under 35 U.S.C. 154(b) by 16 days.

(21) Appl. No.: 14/267,493

(22) Filed: May 1, 2014

(65) Prior Publication Data
US 2015/0318299 A1   Nov. 5, 2015

(51) Int. Cl.
*H01L 29/66* (2006.01)
*H01L 27/115* (2006.01)

(52) U.S. Cl.
CPC ..... *H01L 27/11582* (2013.01); *H01L 27/1157* (2013.01)

(58) Field of Classification Search
CPC ................................................. H01L 27/11582
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,115,914 A | 9/1978 | Harari |
| 4,217,601 A | 8/1980 | DeKeersmaecker et al. |
| RE31,083 E | 11/1982 | DeKeersmaecker et al. |
| 4,452,592 A | 6/1984 | Tsai |
| 4,599,705 A | 7/1986 | Holmberg et al. |
| 4,630,086 A | 12/1986 | Sato et al. |
| 4,719,594 A | 1/1988 | Young et al. |

(Continued)

FOREIGN PATENT DOCUMENTS

| | | |
|---|---|---|
| CN | 1759482 A | 4/2006 |
| CN | 101350360 A | 1/2009 |

(Continued)

OTHER PUBLICATIONS

Ovonyx Non-Confidential paper entitled "Ovonic Unified Memory," Dec. 1999, pp. 1-80.

(Continued)

*Primary Examiner* — Marc Armand
*Assistant Examiner* — Sarah Salerno
(74) *Attorney, Agent, or Firm* — Yiding Wu; Haynes Beffel & Wolfeld LLP

(57) ABSTRACT

A memory device includes an array of strings of memory cells. The device includes a plurality of stacks of conductive strips separated by insulating material, including at least a bottom plane of conductive strips, a plurality of intermediate planes of conductive strips, and a top plane of conductive strips. A plurality of vertical active strips is formed between the plurality of stacks. Charge storage structures are formed in interface regions at cross-points between side surfaces of the conductive strips in the plurality of intermediate planes and the vertical active strips in the plurality of vertical active strips. Gate dielectric, having a different composition than the charge storage structures, is formed in interface regions at cross-points between the vertical active strips and side surfaces of the conductive strips in at least one of the top plane of conductive strips and the bottom plane of conductive strips.

13 Claims, 29 Drawing Sheets

(56) References Cited

U.S. PATENT DOCUMENTS

| | | |
|---|---|---|
| 4,769,339 A | 9/1988 | Ishii |
| 4,876,220 A | 10/1989 | Mohsen et al. |
| 4,881,114 A | 11/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,286,994 A | 2/1994 | Ozawa et al. |
| 5,319,229 A | 6/1994 | Shimoji et al. |
| 5,332,923 A | 7/1994 | Takeuchi |
| 5,374,564 A | 12/1994 | Bruel |
| 5,389,566 A | 2/1995 | Lage |
| 5,391,901 A | 2/1995 | Tanabe |
| 5,497,016 A | 3/1996 | Koh |
| 5,515,488 A | 5/1996 | Hoppe et al. |
| 5,534,712 A | 7/1996 | Ovshinsky et al. |
| 5,550,396 A | 8/1996 | Tsutsumi |
| 5,599,724 A | 2/1997 | Yoshida |
| 5,687,112 A | 11/1997 | Ovshinsky |
| 5,688,713 A | 11/1997 | Linliu et al. |
| 5,716,883 A | 2/1998 | Tseng |
| 5,751,012 A | 5/1998 | Wolstenholme et al. |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,851,881 A | 12/1998 | Lin et al. |
| 5,869,843 A | 2/1999 | Harshfield |
| 5,879,955 A | 3/1999 | Gonzalez et al. |
| 5,902,704 A | 5/1999 | Schoenborn et al. |
| 5,912,489 A | 6/1999 | Chen et al. |
| 5,920,788 A | 7/1999 | Reinberg |
| 5,933,365 A | 8/1999 | Klersy et al. |
| 5,952,671 A | 9/1999 | Reinberg et al. |
| 5,952,692 A | 9/1999 | Nakazato et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,991,193 A | 11/1999 | Gallagher et al. |
| 5,993,667 A | 11/1999 | Overman |
| 5,998,244 A | 12/1999 | Wolstenholme et al. |
| 6,009,033 A | 12/1999 | Li et al. |
| 6,011,725 A | 1/2000 | Eitan |
| 6,025,220 A | 2/2000 | Sandhu |
| 6,026,026 A | 2/2000 | Chan et al. |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,074,917 A | 6/2000 | Chang et al. |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,133,603 A | 10/2000 | Nomoto |
| 6,147,395 A | 11/2000 | Gilgen |
| 6,150,253 A | 11/2000 | Doan et al. |
| 6,153,890 A | 11/2000 | Wolstenholme et al. |
| 6,169,693 B1 | 1/2001 | Chan et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,218,700 B1 | 4/2001 | Papadas |
| 6,236,059 B1 | 5/2001 | Wolstenholme et al. |
| 6,251,717 B1 | 6/2001 | Ramsbey et al. |
| RE37,259 E | 7/2001 | Ovshinsky |
| 6,255,166 B1 | 7/2001 | Ogura et al. |
| 6,271,090 B1 | 8/2001 | Huang et al. |
| 6,280,684 B1 | 8/2001 | Yamada et al. |
| 6,287,887 B1 | 9/2001 | Gilgen |
| 6,287,915 B1 | 9/2001 | Muramatsu |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,323,117 B1 | 11/2001 | Noguchi |
| 6,326,307 B1 | 12/2001 | Lindley et al. |
| 6,333,214 B1 | 12/2001 | Kim et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,469,343 B1 | 10/2002 | Miura et al. |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,512,263 B1 | 1/2003 | Yuan et al. |
| 6,512,696 B1 | 1/2003 | Fan et al. |
| 6,514,788 B2 | 2/2003 | Quinn |
| 6,514,820 B2 | 2/2003 | Ahn et al. |
| 6,531,359 B1 | 3/2003 | Tempel et al. |
| 6,534,781 B2 | 3/2003 | Dennison |
| 6,545,903 B1 | 4/2003 | Wu |
| 6,551,866 B1 | 4/2003 | Maeda |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B2 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,605,840 B1 | 8/2003 | Wu |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,653,712 B2 | 11/2003 | Knall et al. |
| 6,657,253 B2 | 12/2003 | Kim et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,680,505 B2 | 1/2004 | Ohba et al. |
| 6,709,928 B1 | 3/2004 | Jenne et al. |
| 6,713,315 B2 | 3/2004 | Kuo et al. |
| 6,720,630 B2 | 4/2004 | Mandelman et al. |
| 6,737,675 B2 | 5/2004 | Patel et al. |
| 6,740,928 B2 | 5/2004 | Yoshii et al. |
| 6,744,088 B2 | 6/2004 | Dennison |
| 6,750,079 B2 | 6/2004 | Lowrey et al. |
| 6,750,101 B2 | 6/2004 | Lung |
| 6,770,939 B2 | 8/2004 | Subramanian et al. |
| 6,781,858 B2 | 8/2004 | Fricke et al. |
| 6,784,480 B2 | 8/2004 | Bhattacharyya |
| 6,791,102 B2 | 9/2004 | Johnson et al. |
| 6,792,365 B2 | 9/2004 | Raitter |

(56) References Cited

U.S. PATENT DOCUMENTS

| | | |
|---|---|---|
| 6,797,979 B2 | 9/2004 | Chiang et al. |
| 6,798,712 B2 | 9/2004 | Gieseke et al. |
| 6,800,504 B2 | 10/2004 | Li et al. |
| 6,800,563 B2 | 10/2004 | Xu |
| 6,815,704 B1 | 11/2004 | Chen |
| 6,815,764 B2 | 11/2004 | Bae et al. |
| 6,818,558 B1 | 11/2004 | Rathor et al. |
| 6,828,240 B2 | 12/2004 | Hellig et al. |
| 6,838,692 B1 | 1/2005 | Lung |
| 6,849,905 B2 | 2/2005 | Ilkbahar et al. |
| 6,850,432 B2 | 2/2005 | Lu et al. |
| 6,858,899 B2 | 2/2005 | Walker et al. |
| 6,858,906 B2 | 2/2005 | Lee et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,897,533 B1 | 5/2005 | Yang et al. |
| 6,900,517 B2 | 5/2005 | Tanaka et al. |
| 6,903,362 B2 | 6/2005 | Wyeth et al. |
| 6,906,361 B2 | 6/2005 | Zhang |
| 6,906,940 B1 | 6/2005 | Lue |
| 6,909,107 B2 | 6/2005 | Rodgers et al. |
| 6,912,163 B2 | 6/2005 | Zheng et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,936,884 B2 | 8/2005 | Chae et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,977,201 B2 | 12/2005 | Jung |
| 6,992,932 B2 | 1/2006 | Cohen |
| 7,005,350 B2 | 2/2006 | Walker et al. |
| 7,018,783 B2 | 3/2006 | Iwasaki et al. |
| 7,018,911 B2 | 3/2006 | Lee et al. |
| 7,020,012 B2 | 3/2006 | Rinerson et al. |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,057,938 B2 | 6/2006 | Yeh et al. |
| 7,067,837 B2 | 6/2006 | Hwang et al. |
| 7,067,864 B2 | 6/2006 | Nishida et al. |
| 7,067,865 B2 | 6/2006 | Lung |
| 7,075,828 B2 | 7/2006 | Lue et al. |
| 7,078,273 B2 | 7/2006 | Matsuoka et al. |
| 7,081,377 B2 | 7/2006 | Cleeves |
| 7,084,454 B2 | 8/2006 | Pinnow et al. |
| 7,099,180 B1 | 8/2006 | Dodge et al. |
| 7,115,469 B1 | 10/2006 | Halliyal et al. |
| 7,115,927 B2 | 10/2006 | Hideki et al. |
| 7,115,942 B2 | 10/2006 | Wang |
| 7,115,967 B2 | 10/2006 | Cleeves |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,129,538 B2 | 10/2006 | Lee et al. |
| 7,132,675 B2 | 11/2006 | Gilton |
| 7,133,313 B2 | 11/2006 | Shih |
| 7,151,273 B2 | 12/2006 | Campbell et al. |
| 7,151,692 B2 | 12/2006 | Wu |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,164,603 B2 | 1/2007 | Shih et al. |
| 7,166,533 B2 | 1/2007 | Happ |
| 7,169,635 B2 | 1/2007 | Kozicki |
| 7,177,169 B2 | 2/2007 | Scheuerlein |
| 7,187,590 B2 | 3/2007 | Zous et al. |
| 7,190,614 B2 | 3/2007 | Wu |
| 7,202,493 B2 | 4/2007 | Lung |
| 7,208,751 B2 | 4/2007 | Ooishi |
| 7,209,390 B2 | 4/2007 | Lue et al. |
| 7,214,958 B2 | 5/2007 | Happ |
| 7,220,983 B2 | 5/2007 | Lung |
| 7,229,883 B2 | 6/2007 | Wang et al. |
| 7,236,394 B2 | 6/2007 | Chen et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,274,594 B2 | 9/2007 | Pascucci et al. |
| 7,277,317 B2 | 10/2007 | Le Phan |
| 7,291,556 B2 | 11/2007 | Choi et al. |
| 7,301,818 B2 | 11/2007 | Lu et al. |
| 7,309,630 B2 | 12/2007 | Fan et al. |
| 7,315,474 B2 | 1/2008 | Lue |
| 7,321,130 B2 | 1/2008 | Lung et al. |
| 7,323,708 B2 | 1/2008 | Lee et al. |
| 7,323,734 B2 | 1/2008 | Ha et al. |
| 7,327,592 B2 | 2/2008 | Silvestri |
| 7,332,370 B2 | 2/2008 | Chang et al. |
| 7,336,526 B2 | 2/2008 | Osada et al. |
| 7,343,214 B2 | 3/2008 | Koh |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,369,436 B2 | 5/2008 | Forbes |
| 7,379,328 B2 | 5/2008 | Osada et al. |
| 7,382,647 B1 | 6/2008 | Gopalakrishnan |
| 7,382,654 B2 | 6/2008 | Hsu et al. |
| 7,385,235 B2 | 6/2008 | Lung |
| 7,388,273 B2 | 6/2008 | Burr et al. |
| 7,394,088 B2 | 7/2008 | Lung |
| 7,394,089 B2 | 7/2008 | Doyle et al. |
| 7,397,060 B2 | 7/2008 | Lung |
| 7,400,522 B2 | 7/2008 | Toda et al. |
| 7,420,242 B2 | 9/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,459,715 B2 | 12/2008 | Toda et al. |
| 7,473,576 B2 | 1/2009 | Lung |
| 7,473,589 B2 | 1/2009 | Lai et al. |
| 7,477,535 B2 | 1/2009 | Lahtinen et al. |
| 7,479,649 B2 | 1/2009 | Lung |
| 7,485,891 B2 | 2/2009 | Hamann et al. |
| 7,486,534 B2 | 2/2009 | Chen et al. |
| 7,502,252 B2 | 3/2009 | Fuji et al. |
| 7,504,653 B2 | 3/2009 | Lung |
| 7,507,986 B2 | 3/2009 | Lung |
| 7,514,334 B2 | 4/2009 | Chen et al. |
| 7,514,705 B2 | 4/2009 | Breitwisch et al. |
| 7,514,742 B2 | 4/2009 | Yeh et al. |
| 7,515,461 B2 | 4/2009 | Happ et al. |
| 7,555,358 B2 | 6/2009 | Jones et al. |
| 7,560,337 B2 | 7/2009 | Ho et al. |
| 7,569,468 B2 | 8/2009 | Chen et al. |
| 7,579,613 B2 | 8/2009 | Lung et al. |
| 7,592,666 B2 | 9/2009 | Noguchi et al. |
| 7,606,059 B2 | 10/2009 | Toda |
| 7,623,370 B2 | 11/2009 | Toda et al. |
| 7,626,228 B2 | 12/2009 | Park et al. |
| 7,629,642 B2 | 12/2009 | Ohba |

(56) References Cited

U.S. PATENT DOCUMENTS

| | | |
|---|---|---|
| 7,663,900 B2 | 2/2010 | Stipe |
| 7,679,960 B2 | 3/2010 | Hyun et al. |
| 7,696,559 B2 | 4/2010 | Arai et al. |
| 7,704,847 B2 | 4/2010 | Cannon et al. |
| 7,709,334 B2 | 5/2010 | Lai et al. |
| 7,718,989 B2 | 5/2010 | Lai et al. |
| 7,746,694 B2 | 6/2010 | Liao |
| 7,763,878 B2 | 7/2010 | Horii et al. |
| 7,778,063 B2 | 8/2010 | Brubaker et al. |
| 7,851,849 B2 | 12/2010 | Kiyotoshi |
| 7,855,378 B2 | 12/2010 | Lin et al. |
| 7,868,313 B2 | 1/2011 | Breitwisch et al. |
| 7,884,343 B2 | 2/2011 | Lung et al. |
| 7,884,417 B2 | 2/2011 | Mizukami et al. |
| 7,936,611 B2 | 5/2011 | Lee et al. |
| 7,956,424 B2 | 6/2011 | Toyama |
| 7,977,735 B2 | 7/2011 | Lai et al. |
| 7,978,492 B2 | 7/2011 | Johnson et al. |
| 7,983,065 B2 | 7/2011 | Samachisa |
| 7,995,371 B2 | 8/2011 | Rinerson et al. |
| 8,004,888 B2 | 8/2011 | Parker |
| 8,076,715 B2 | 12/2011 | Melik-Martirosian |
| 8,085,615 B2 | 12/2011 | Taguchi |
| 8,134,139 B2 | 3/2012 | Lin et al. |
| 8,138,573 B2 | 3/2012 | Cannon et al. |
| 8,188,517 B2 | 5/2012 | Choi |
| 8,193,573 B2 | 6/2012 | Bronner et al. |
| 8,199,576 B2 | 6/2012 | Fasoli et al. |
| 8,203,187 B2 | 6/2012 | Lung et al. |
| 8,208,279 B2 | 6/2012 | Lue |
| 8,236,623 B2 | 8/2012 | Schricker et al. |
| 8,247,862 B2 | 8/2012 | Babcock et al. |
| 8,279,656 B2 | 10/2012 | Chien et al. |
| 8,343,871 B2 | 1/2013 | Shih et al. |
| 8,344,475 B2 | 1/2013 | Shaeffer et al. |
| 8,363,476 B2 | 1/2013 | Lue et al. |
| 8,383,512 B2 | 2/2013 | Chen et al. |
| 8,467,219 B2 | 6/2013 | Lue |
| 8,488,387 B2 | 7/2013 | Lue et al. |
| 8,503,213 B2 | 8/2013 | Chen et al. |
| 8,531,886 B2 | 9/2013 | Huang et al. |
| 8,598,032 B2 | 12/2013 | Chen et al. |
| 8,605,495 B2 | 12/2013 | Lung |
| 8,659,944 B2 | 2/2014 | Hung et al. |
| 8,724,390 B2 | 5/2014 | Hung et al. |
| 2002/0042158 A1 | 4/2002 | Kersch et al. |
| 2002/0070457 A1 | 6/2002 | Sun et al. |
| 2002/0113273 A1 | 8/2002 | Hwang et al. |
| 2003/0003647 A1 | 1/2003 | Dennison et al. |
| 2003/0025147 A1 | 2/2003 | Nomoto et al. |
| 2003/0030100 A1 | 2/2003 | Lee et al. |
| 2003/0032242 A1 | 2/2003 | Lee et al. |
| 2003/0042534 A1 | 3/2003 | Bhattacharyya |
| 2003/0047755 A1 | 3/2003 | Lee et al. |
| 2003/0095426 A1 | 5/2003 | Hush et al. |
| 2003/0146465 A1 | 8/2003 | Wu |
| 2003/0186481 A1 | 10/2003 | Lung |
| 2003/0215978 A1 | 11/2003 | Maimon et al. |
| 2003/0224564 A1 | 12/2003 | Kang et al. |
| 2004/0023499 A1 | 2/2004 | Hellig et al. |
| 2004/0026686 A1 | 2/2004 | Lung |
| 2004/0051094 A1 | 3/2004 | Ooishi |
| 2004/0079983 A1 | 4/2004 | Chae et al. |
| 2004/0102002 A1 | 5/2004 | Sandhu et al. |
| 2004/0113137 A1 | 6/2004 | Lowrey |
| 2004/0114317 A1 | 6/2004 | Chiang et al. |
| 2004/0119122 A1 | 6/2004 | Ilkbahar et al. |
| 2004/0124466 A1 | 7/2004 | Walker et al. |
| 2004/0165422 A1 | 8/2004 | Hideki et al. |
| 2004/0174728 A1 | 9/2004 | Takano et al. |
| 2004/0183126 A1 | 9/2004 | Bae et al. |
| 2004/0188714 A1 | 9/2004 | Scheuerlein et al. |
| 2004/0238974 A1 | 12/2004 | Baik |
| 2004/0248339 A1 | 12/2004 | Lung |
| 2004/0251489 A1 | 12/2004 | Jeon et al. |
| 2004/0256610 A1 | 12/2004 | Lung |
| 2004/0256679 A1 | 12/2004 | Hu |
| 2005/0006696 A1 | 1/2005 | Noguchi et al. |
| 2005/0013173 A1 | 1/2005 | Prinz et al. |
| 2005/0018526 A1 | 1/2005 | Lee |
| 2005/0019975 A1 | 1/2005 | Lee et al. |
| 2005/0023603 A1 | 2/2005 | Eldridge et al. |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0062098 A1 | 3/2005 | Mahajani et al. |
| 2005/0074937 A1 | 4/2005 | Jung |
| 2005/0093022 A1 | 5/2005 | Lung |
| 2005/0093054 A1 | 5/2005 | Jung |
| 2005/0127347 A1 | 6/2005 | Choi et al. |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0219906 A1 | 10/2005 | Wu |
| 2005/0230724 A1 | 10/2005 | Hsu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0263829 A1 | 12/2005 | Song et al. |
| 2005/0270849 A1 | 12/2005 | Lue |
| 2005/0280061 A1 | 12/2005 | Lee |
| 2005/0281085 A1 | 12/2005 | Wu |
| 2006/0001174 A1 | 1/2006 | Matsui |
| 2006/0003263 A1 | 1/2006 | Chang |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0077741 A1 | 4/2006 | Wang et al. |
| 2006/0088983 A1 | 4/2006 | Fujisawa et al. |
| 2006/0091467 A1 | 5/2006 | Doyle et al. |
| 2006/0091476 A1 | 5/2006 | Pinnow et al. |
| 2006/0094154 A1 | 5/2006 | Lung |
| 2006/0097341 A1 | 5/2006 | Pellizzer et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118858 A1 | 6/2006 | Jeon et al. |
| 2006/0118913 A1 | 6/2006 | Yi et al. |
| 2006/0124916 A1 | 6/2006 | Lung |
| 2006/0124991 A1 | 6/2006 | Ohba |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175596 A1 | 8/2006 | Happ et al. |
| 2006/0175599 A1 | 8/2006 | Happ |
| 2006/0198183 A1 | 9/2006 | Kawahara et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202261 A1 | 9/2006 | Lue et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |

(56) References Cited

U.S. PATENT DOCUMENTS

| | | |
|---|---|---|
| 2006/0258090 A1 | 11/2006 | Bhattacharyya et al. |
| 2006/0261392 A1 | 11/2006 | Lee et al. |
| 2006/0261401 A1 | 11/2006 | Bhattacharyya |
| 2006/0266993 A1 | 11/2006 | Suh et al. |
| 2006/0281260 A1 | 12/2006 | Lue |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0012988 A1 | 1/2007 | Bhattacharyya |
| 2007/0029625 A1 | 2/2007 | Lue et al. |
| 2007/0030721 A1 | 2/2007 | Segal et al. |
| 2007/0031999 A1 | 2/2007 | Ho et al. |
| 2007/0037101 A1 | 2/2007 | Morioka |
| 2007/0040159 A1 | 2/2007 | Wang |
| 2007/0045605 A1 | 3/2007 | Hsueh |
| 2007/0045606 A1 | 3/2007 | Magistretti et al. |
| 2007/0045718 A1 | 3/2007 | Bhattacharyya |
| 2007/0051936 A1 | 3/2007 | Pellizzer et al. |
| 2007/0069283 A1 | 3/2007 | Shih et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0120179 A1 | 5/2007 | Park et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0132049 A1 | 6/2007 | Stipe |
| 2007/0138458 A1 | 6/2007 | Lung |
| 2007/0138539 A1 | 6/2007 | Wu et al. |
| 2007/0140001 A1 | 6/2007 | Motoi et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235710 A1 | 10/2007 | Matsuzaki et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0246782 A1 | 10/2007 | Philipp et al. |
| 2007/0249090 A1 | 10/2007 | Philipp et al. |
| 2007/0252127 A1 | 11/2007 | Arnold et al. |
| 2007/0252201 A1 | 11/2007 | Kito et al. |
| 2007/0253233 A1 | 11/2007 | Mueller et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0048237 A1 | 2/2008 | Iwata |
| 2008/0073635 A1 | 3/2008 | Kiyotoshi et al. |
| 2008/0080251 A1 | 4/2008 | Chang et al. |
| 2008/0084729 A1 | 4/2008 | Cho et al. |
| 2008/0094871 A1 | 4/2008 | Parkinson |
| 2008/0096327 A1 | 4/2008 | Lee et al. |
| 2008/0099830 A1 | 5/2008 | Lue et al. |
| 2008/0101109 A1 | 5/2008 | Haring-Bolivar et al. |
| 2008/0101110 A1 | 5/2008 | Happ et al. |
| 2008/0106931 A1 | 5/2008 | Toda |
| 2008/0116441 A1 | 5/2008 | Raghuram et al. |
| 2008/0116506 A1 | 5/2008 | Lue |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0151631 A1 | 6/2008 | Hyun et al. |
| 2008/0157053 A1 | 7/2008 | Lai et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0170429 A1 | 7/2008 | Bertin et al. |
| 2008/0175032 A1 | 7/2008 | Tanaka et al. |
| 2008/0179582 A1 | 7/2008 | Burr et al. |
| 2008/0180990 A1 | 7/2008 | Lung |
| 2008/0180994 A1 | 7/2008 | Katsumata et al. |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0203614 A1 | 8/2008 | Holzmann et al. |
| 2008/0224119 A1 | 9/2008 | Burr et al. |
| 2008/0225489 A1 | 9/2008 | Cai et al. |
| 2008/0247230 A1 | 10/2008 | Lee et al. |
| 2008/0251878 A1 | 10/2008 | Mandelman et al. |
| 2008/0251934 A1 | 10/2008 | Mandelman et al. |
| 2008/0265234 A1 | 10/2008 | Lung |
| 2008/0265235 A1 | 10/2008 | Kamigaichi et al. |
| 2008/0285350 A1 | 11/2008 | Yeh |
| 2008/0303014 A1 | 12/2008 | Goux et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0039414 A1 | 2/2009 | Lue et al. |
| 2009/0039417 A1 | 2/2009 | Chen et al. |
| 2009/0042335 A1 | 2/2009 | Lung |
| 2009/0057641 A1 | 3/2009 | Lung |
| 2009/0090960 A1* | 4/2009 | Izumi .................... H01L 27/115 257/324 |
| 2009/0097309 A1 | 4/2009 | Mizukami et al. |
| 2009/0097321 A1 | 4/2009 | Kim et al. |
| 2009/0098678 A1 | 4/2009 | Lung |
| 2009/0117707 A1 | 5/2009 | Shimomura et al. |
| 2009/0148980 A1 | 6/2009 | Yu |
| 2009/0166603 A1 | 7/2009 | Lung |
| 2009/0166723 A1 | 7/2009 | Sung et al. |
| 2009/0184360 A1 | 7/2009 | Jin et al. |
| 2009/0189202 A1 | 7/2009 | Baptiste |
| 2009/0212348 A1 | 8/2009 | Toyama |
| 2009/0225588 A1 | 9/2009 | Czubatyj et al. |
| 2009/0230459 A1* | 9/2009 | Kito .................. H01L 27/11565 257/324 |
| 2009/0298223 A1 | 12/2009 | Cheek et al. |
| 2010/0025811 A1 | 2/2010 | Bronner et al. |
| 2010/0059808 A1 | 3/2010 | Zheng et al. |

(56) References Cited

U.S. PATENT DOCUMENTS

| | | |
|---|---|---|
| 2010/0074004 A1 | 3/2010 | Parker |
| 2010/0074007 A1 | 3/2010 | Parker |
| 2010/0120226 A1 | 5/2010 | Yamazaki et al. |
| 2010/0193763 A1 | 8/2010 | Chen et al. |
| 2010/0226195 A1 | 9/2010 | Lue |
| 2010/0237312 A1 | 9/2010 | Seol et al. |
| 2010/0240205 A1* | 9/2010 | Son .................. H01L 27/11551 438/588 |
| 2010/0246235 A1 | 9/2010 | Gouin |
| 2010/0259961 A1 | 10/2010 | Fasoli et al. |
| 2010/0265773 A1 | 10/2010 | Lung et al. |
| 2010/0270593 A1 | 10/2010 | Lung et al. |
| 2010/0291747 A1 | 11/2010 | Lung et al. |
| 2011/0031630 A1 | 2/2011 | Hashimoto |
| 2011/0034003 A1 | 2/2011 | Lung |
| 2011/0038208 A1 | 2/2011 | Chang et al. |
| 2011/0069524 A1 | 3/2011 | Toba et al. |
| 2011/0085370 A1 | 4/2011 | Chen et al. |
| 2011/0095353 A1 | 4/2011 | Lue |
| 2011/0127483 A1 | 6/2011 | Sonehara |
| 2011/0140070 A1 | 6/2011 | Kim |
| 2011/0149656 A1 | 6/2011 | Tang et al. |
| 2011/0180775 A1 | 7/2011 | Lin et al. |
| 2011/0227026 A1 | 9/2011 | Sekar et al. |
| 2011/0233651 A1 | 9/2011 | Inoue et al. |
| 2011/0241077 A1 | 10/2011 | Lung |
| 2011/0286283 A1 | 11/2011 | Lung et al. |
| 2011/0292738 A1 | 12/2011 | Hsu et al. |
| 2011/0303970 A1* | 12/2011 | Kim .................. H01L 27/11578 257/324 |
| 2012/0007167 A1 | 1/2012 | Hung et al. |
| 2012/0051137 A1 | 3/2012 | Hung et al. |
| 2012/0068241 A1 | 3/2012 | Sakuma et al. |
| 2012/0112260 A1 | 5/2012 | Kim et al. |
| 2012/0168841 A1 | 7/2012 | Chen et al. |
| 2012/0168849 A1 | 7/2012 | Choi et al. |
| 2012/0181580 A1 | 7/2012 | Lue et al. |
| 2012/0181599 A1 | 7/2012 | Lung |
| 2012/0181654 A1 | 7/2012 | Lue |
| 2012/0181684 A1 | 7/2012 | Lue et al. |
| 2012/0182801 A1 | 7/2012 | Lue |
| 2012/0182802 A1 | 7/2012 | Hung et al. |
| 2012/0182804 A1 | 7/2012 | Hung et al. |
| 2012/0182807 A1 | 7/2012 | Lue |
| 2012/0182808 A1 | 7/2012 | Lue et al. |
| 2012/0188813 A1 | 7/2012 | Chien et al. |
| 2012/0235224 A1 | 9/2012 | Yeh |
| 2012/0236642 A1 | 9/2012 | Lue |
| 2012/0267701 A1* | 10/2012 | Chae .................. H01L 27/1157 257/324 |
| 2012/0281471 A1 | 11/2012 | Hung et al. |
| 2012/0281478 A1 | 11/2012 | Lue et al. |
| 2012/0281481 A1 | 11/2012 | Lue et al. |
| 2012/0327714 A1 | 12/2012 | Lue |
| 2012/0327719 A1 | 12/2012 | Lue |
| 2013/0003434 A1 | 1/2013 | Lue et al. |
| 2013/0088920 A1 | 4/2013 | Huang et al. |
| 2013/0119455 A1 | 5/2013 | Chen et al. |
| 2013/0175598 A1 | 7/2013 | Chen et al. |
| 2013/0182487 A1 | 7/2013 | Lee et al. |
| 2013/0277799 A1 | 10/2013 | Chen et al. |
| 2014/0131653 A1 | 5/2014 | Lee et al. |
| 2014/0192594 A1* | 7/2014 | Lue .................. G11C 16/10 365/185.11 |
| 2014/0198576 A1 | 7/2014 | Hung et al. |

FOREIGN PATENT DOCUMENTS

| | | |
|---|---|---|
| CN | 101477987 A | 7/2009 |
| EP | 01677311 A1 | 7/2006 |
| EP | 01677312 A1 | 7/2006 |
| EP | 1936681 A1 | 6/2008 |
| EP | 2048709 A2 | 4/2009 |
| JP | 11040682 A | 2/1999 |
| JP | 2003068893 A | 3/2003 |
| JP | 2004363329 A | 12/2004 |
| JP | 2005184029 | 7/2005 |
| JP | 2005197624 A | 7/2005 |
| KR | 20010056888 A | 7/2001 |
| KR | 20050011203 A | 1/2005 |
| TW | 200742039 | 11/2007 |
| WO | 2011022123 A1 | 2/2011 |

OTHER PUBLICATIONS

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Paul et al., "Impact of a Process Variation on Nanowire and Nanotube Device Performance," IEEE Trans. on Electron Devices, vol. 54, No. 9, Sep. 2007, pp. 2369-2376.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Qureshi M. et al., "Practical and Secure PCM Systems by Online Detection of Malicious Write Streams," Proc. of the IEEE HPCA, pp. 478-489, 2011.

Qureshi M.K. et al. "Improving Read Performance of Phase Change Memories via Write Cancellation and Write Pausing," IEEE 16th Int'l Symp. High Performance Computer Architecture (HPCA), Bangalore, Jan. 2010, pp. 1-11.

Qureshi M.K. et al., "Enhancing Lifetime and Security of PCM-Based Main Memory with Start-Gap Wear Leveling," Proc. 42nd Annual IEEE/ACM Int'l Symp. on Microarchitecture (MICRO '09) New York, NY, Dec. 2009, pp. 14-23.

Qureshi M.K. et al., "Scalable High Performance Main Memory System Using Phase-Change Memory Technology," Proc. 36th Annual Int'l Symp. on Computer Architecture (ISCA '09), Jun. 2009, Austin, TX, pp. 24-33.

Radaelli, A. et al., "Electronic Switching Effect and Phase-Change Transition in Chalcogenide Materials," IEEE Electron Device Letters, Oct. 2004, pp. 684-686, vol. 25, No. 10.

Risch, Lothar, et al., "Recent Progress with Vertical Transistors," Solid-State Device Research Conference, 1997. Proceeding of the 27th European Sep. 22-24, 1997 pp. 34-41.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Sakamoto W., et al., "Reliability Improvement in Planar MONOS Cell for 20nm-node Multi-Level NAND Flash Memory and beyond," Tech. Digest of Intl Electron Devices Meeting 2009, pp. 34.4.1-34.4.4.

Sasago Y., et al., "Cross-point phase change memory with 4F2 cell size driven by low-contact-resistivity poly-Si diode," 2009 Symposium on VLSI Technology Digest of Tech. Papers, pp. 24-25.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Schechter S. et al., "Use ECP, not ECC, for Hard Failures in Resistive Memories," Proc. 37th Annual Int'l Symp. on Computer Architecture (ISCA '10) Saint-Malo, France, Jun. 2010, 12 pp.

(56) References Cited

OTHER PUBLICATIONS

Seong N.H. et al., "Security Refresh: Prevent Malicious Wear-Out and Increase Durability for Phase-Change Memory with Dynamically Randomized Address Mapping," Proc. of the IEEE/ACM ISCA, pp. 383-394, 2010.
Shih et al., "A Novel 2-bit/cell Nitride Storage Flash Memory with Greater than 1M P/E-cycle Endurance," IEEE IEDM 2004 881-884 (36.3.1-36.3.4).
Shin et al., High Reliable SONOS-type NAND Flash Memory Cell with Al2O3 or Top Oxide, IEEE IEDM, Feb. 16-20, 2003 (MANOS).
Shin Y. et al., "A Novel NAND-type MONOS Memory using 63nm Process Technology for Multi-Gigabit Flash EEPROMs," IEEE IEDM Tech. Digest, 2005, pp. 327-330.
Sim et al., "Fully 3-Dimensional NOR Flash Cell with Recessed Channel and Cylindrical Floating Gate—A Scaling Direction for 65nm and Beyond," 2006 Symposium on VLSI Technology Digest of Technical Papers, 2006 IEEE, pp. 1-2.
Smullen C.W. et al., "Accelerating Enterprise Sollid-State Disks with Non-Volatile Merge Caching," Proc. Int'l Conf. on Green Computing (GREENCOMP '10) Chicago, IL, Aug. 2010, pp. 203-214.
Strauss, Karl F. et al., "Overview of Radiation Tolerant Unlimited Write Cycle Non-Volatile Memory," IEEE Mar. 18-25, 2000, pp. 399-408.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.
Sung et al., "Multi-Layer SONOS with Direct Tunnel Oxide for High Speed and Long Retention Time," IEEE Silicon Nanoelectronics Workshop Jun. 2002 83-84.
Takata, M., et al., "New Non-Volatile Memory with Extremely High Density Metal Nano-Dots," IEEE IEDM 03-553, 22.5.1-22.5.4.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
Tsai et al., "Novel SONOS-Type Nonvolatile Memory Device with Suitable Band Offset in HfAlO Charge-Trapping Layer," Int'l Symp. on VLSI Tech, Systems and Applications Apr. 23-25, 2007, 2 pages.
Walker et al., "3D TFT-SONOS Memory Cell for Ultra-High Density File Storage Applications," 2003 Symposium on VLSI Tech Digest of Technical Papers, 29-30.
Wang H-H et al., "A New Read-Distrub Failure Mechanism Caused by Boosting Hot-Carrier Injection Effect in MLC NAND Flash Memory," IEEE Int'l Memory Workshop, 2009, pp. 1-2.
Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.
White et al., "On the Go with SONOS" IEEE Circuits and Devices, Jul. 2000, 22-31.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era—vol. 4, pp. 674-679, 2004.
Wu Q et al., "A First Study on Self-Healing Solid-State Drives," IEEE Int'l Memory Workshop (IMW), May 2011, 4pp.
Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.
Wuttig, Matthias, "Towards a Universal Memory?" Nature Materials, Apr. 2005, pp. 265-266, vol. 4.
Xie P. et al., "Analysis of Higher-Order Pitch Division for Sub-32nm Lithography," Optical Microlithography XXII, Proc. SPIE vol. 7274, Mar. 2009, 8 pp.
Yamada et al., "A self-convergence erasing scheme for a simple stacked gate flash EEPROM," Proc. Int'l. Electron Devices Meeting, Dec. 1991 307-310.
Yamada, Noboru, "Potential of Ge—Sb—Te phase-change optical disks for high-data-rate recording in the near future," (Conference Proceedings Paper), Jul. 30, 1997, vol. 3109, 10 pages.
Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp. 931-934.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Yoon D.H. et al. "FREE-p: Protecting Non-volatile Memory against both Hard and Soft Errors," Proc. of the IEEE HPCA, pp. 466-477, 2011.
Yun et al, "Stacked-nanowire device with virtual source/drain (SD-VSD) for 3D NAND flash memory application," Solid-State Electronics, vol. 64, pp. 42-46 (Jul. 26, 2011).
Yun et al., "Single-Crystalline Si STacked ARray (STAR)," IEEE Trans. Electron. Devices, vol. 58, pp. 1006-1014 (Apr. 2011).
Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hu J. et al., "Reducing Write Activities on Non-volatile Memories in Embedded CMPs via Data Migration and Recomputation," Proc. of the IEEE/ACM DAC, Jun. 13-18, 2010, pp. 350-355.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Ishiduki M. et al., "Optimal Device Structure for Pipe-shaped BiCS Flash Memory for Ultra High Density Storage Device with Excellent Performance and Reliability," Electron Devices Meeting (IEDM), 2009 IEEE Int'l, Baltimore MD, pp. 27.3.1-27.3.4.
Ito, et al., "A Novel MNOS Technology Using Gate Hole Injection in Erase Operation for Embedded Nonvolatile Memory Applications." 2004 Symp. on VLSI Tech Dig. of Papers 2004, 80-81.
Iwasaki, Hiroko et al., "Completely Erasable Phase Change Optical Disk," Jpn. J. Appl. Phys., Feb. 1992, pp. 461-465, vol. 31.
Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.
Jiang L. et al., "Cooperative Integration of Wear-Leveling and Salvaging for PCM Main Memory," Proc. of the IEEE/IFIP DSN, pp. 221-232, 2011.

(56) References Cited

OTHER PUBLICATIONS

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.
Kau DC, et al., "A stackable cross point phase change memory," 2009 International Electron Devices Meeting, Baltimore MD, pp. 27.1.1-27.1.4.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Kim et al., "Robust Multi-Bit Programmable Flash Memory Using a Resonant Tunnel Barrier," Electron Dev. Mtg. Dec. 5-7, 2005, IEDM Technical Digest 861-864.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.
Kinoshita, A, et al., "High-Performance 50-nm-Gate-Length Schottky-Source/Drain MOSFETs with Dopant-Segregation Junctions," IEEE Symp. on VLSI Technology Digest of Papers, Jun. 14-16, 2005, pp. 158-159.
Kinoshita, A, et al., "Solution for High-Performance Schottky-Source/Drain MOSFETs: Schottky Barrier Height Engineering with Dopant Segregation Technique," IEEE Symp. on VLSI Technology Digest of Papers, Jun. 15-17, 2004, pp. 168-169.
Kojima, Rie et al., "Ge—Sn—Sb—Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai et al., "A Multi-Layer Stackable Thin-Film Transistor (TFT) NAND-Type Flash Memory," IEEE Int'l Electron Devices Meeting, Dec. 11-13, 2006, 4 pages.
Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.
Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Lee B.C. et al., Architecting Phase Change Memory as a Scalable DRAM Alternative, Proc. 36th Annual Int'l Symp. on Computer Architecture (ISCA '09), Austin, TX, Jun. 2009, pp. 2-13.
Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.
Lee, Chang, et al., "A Novel SONOS Structure of SiO2/SiN/Al2O3 with TaN Metal Gate for Multi-Giga Bit Flash Memories," IEEE 2003 4 pages.
Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.
Li F., et al., "Evaluation of SiO2 Antifuse ina 3D-OTP Memory," IEEE Transaction on Device and Materials Reliability, vol. 4, No. 3, 2004, pp. 416-421.
Likharev, "Layered Tunnel Barriers for Nonvolatile Memory Devices," Appl. Phys. Lett. 73(15) Oct. 1998 2137-2139.
Lue et al., "A Novel P-Channel NAND-Type Flash memory 2-bit/cell Operation and High Programming Throughput (>20 MB/sec)," IEEE 2005, 4 pages.
Lue et al., "A BE-SONOS (Bandgap Engineered SONOS) NAND for Post-Floating Gate Era Flash Memory," Int'l Symp on VLSI Tech, Apr. 23-25, 2007, 2 pages.
Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.
Lue et al., "BE-SONOS: A Bandgap Engineered SONOS with Excellent Performance and Reliability," IEDM Tech. Digest Dec. 2005 547-550.
Lue, Hang-Ting et al., Scaling Evaluation of BE-SONOS NAND Flash Beyond 20 nm, 2008 Symposium on VLSI technology, Digest of Papers, Jun. 2008, 116-117.
Maeda, S, et al. "A Vertical F-Shape Transistor (VFT) Cell for 1Gbit DRAM and Beyond," 1994 Symposium on VLSI Technology, Digest of Technical Papers. Jun. 7-9, 1994 pp. 133-134.
Mielke N et al., "Flash EEPROM Threshold Instabilities due to Charge Trapping During Program/Erase Cycling," IEEE Trans. on Device and Materials Reliability, vol. 4, No. 3, Sep. 2004, pp. 335-344.
Minami, et al., "New Scaling Guidelines for MNOS Nonvolatile Memory Devices," IEEE Trans on Electron Devices 38 (11) Nov. 19912519-2526.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.
"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.

(56) References Cited

OTHER PUBLICATIONS

Ahn, S. J. et al., "Highly Reliable 5nm Contact Cell Technology for 256Mb PRAM," VLSI Technology, Digest of Technical Papers, Jun. 14-16, 2005, pp. 98-99.
Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, Dec. 1997, pp. 1-6.
Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Blomme et al., "Multilayer tunneling barriers for nonvolatile memory applications," Device Research Conf, 2002 60th DRC Digest 153-154.
Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.
Buckley, J., et al., "Engineering of 'Conduction Band-Crested Barriers' or 'Dielectric Constant-Crested Barriers' in view of their application of floating-gate non-volatile memory devices," VLSI 2004, 55-56.
Chang L.-P. et al., "An Adaptive Striping Architecture for Flash Memory Storage Systems of Embedded Systems," Proc. of the IEEE RTAS, pp. 187-196, 2002.
Chang Y.-H. et al., "Endurance Enhancement of Flash-Memory Storage Systems: An Efficient Static Wear Leveling Design," Proc. of the IEEE/ACM DAC, pp. 212-217, 2007.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.
Chen, An et al., "Non-Volatile Resistive Switching for Advanced Memory Applications," IEEE IEDM, Dec. 5-7, 2005, 4 pp.
Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.
Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.
Chindalore, et al., "A New Combination-Erase Technique for Erasing Nitride Based (SONOS) Nonvolatile Memories," IEEE Electron Dev. Lett. 24(4) Apr. 2003, 257-259.
Cho S. et al., "Flip-N-Write: A Simple Deterministic Technique to Improve PRAM Write Performance, Energy and Endurance," Proc. of the IEEE/ACM MICRO, pp. 347-357, 2009.
Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.
Condit J. et al., "Better I/O Through Byte-Addressable, Persistent Memory," Proc. of the ACM SIGOPS 22nd Symp. on Operating Systems Principles (SOSP '09) Oct. 2009, Big Sky, Montata, 14pp.
DiMaria, D.J., et al., "Conduction Studies in Silicon Nitride: Dark Currents and Photocurrents," IBM J. Res. Dev. May 1977, 227-244.
Eitan, et al., "NROM: A Novel Localized Trapping, 2-Bit Nonvolatile Memory Cell," IEEE Electron Device Lett 21(11) Nov. 2000, 543-545.
Ferreira A.P. et al., "Increasing PCM Main Memory Lifetime," Proc. of the Conference on Design, Automation and Test in Europe (DATE '10) Dresden, Mar. 2010, pp. 914-919.
Ferreira A.P. et al., "Using PCM in Next-generation Embedded Space Applications," Proc. of the IEEE RTAS, pp. 153-162, 2010.
Fukuzumi et al. "Optimal Integration and Characteristics of Vertical Array Devices for Ultra-High Density, Bit-Cost Scalable Flash Memory," IEEE Dec. 2007, pp. 449-452.
Gal E. et al., "Algorithms and Data Structures for Flash Memories," ACM Computing Surveys, 37(2):138-163, 2005.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Goebel, B., et al., "Fully Depleted Surrounding Gate Transistor (SGT) for 70 nm DRAM and Beyond," IEEE IEDM 2002, 10.8.1-10.8.4.
Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.
Govoreanu et al., "Simulation of Nanofloating Gate Memory with High-k Stacked Dielectrics," IEEE SISPAD Intl. Conf. Sep. 3-5, 2003 299-302.
Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.
H. Tanaka et al., "Bit Cost Scalable Technology with Punch and Plug Process for Ultra High Density Flash Memory," Jun. 2007 Symposium on VLSI Technology Digest of Technical Papers, pp. 14-15.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.
Zhang W. et al., "Exploring Phase Change Memory and 3D Die-Stacking for Power/Thermal Friendly, Fast and Durable Memory Architectures," Proc. of the IEEE PACT, pp. 101-112, 2009.
Zhou P. et al., "A durable and Energy Efficient Main Memory Using Phase Change Memory Technology," Proc. 36th Annual Int'l Symp. on Computer Architecture (ISCA '09), Jun. 2009, Austin, TX, pp. 14-23.

\* cited by examiner

SSL/GSL GATE OXIDE IN 3D VERTICAL CHANNEL NAND

BACKGROUND

Field of the Invention

The present invention relates to high density memory devices, and particularly to memory devices in which multiple planes of memory cells are arranged to provide a three-dimensional 3D array.

Description of Related Art 3D memory devices have been developed in a variety of configurations that include stacks of conductive strips separated by insulating material, and vertical active strips between the stacks. Memory cells including charge storage structures are disposed at interface regions between intermediate planes of conductive strips in the stacks and the vertical active strips. String select switches are disposed at interface regions between a top plane of conductive strips in the stacks and the vertical active strips. Reference select switches are disposed at interface regions between a bottom plane of conductive strips in the stacks and the vertical active strips. In order to reliably control operations of the memory cells, it is desirable that the threshold voltages of string select switches and reference select switches are stable. When string select switches and reference select switches include charge storage structures as the memory cells, string select switches and reference select switches can be charged such that their threshold voltage may vary and thus require additional circuitry to program and erase the switches.

It is desirable to provide a structure for three-dimensional integrated circuit memory that provides string select switches and reference select switches with stable threshold voltages while memory cells are programmed or erased, without requiring additional circuitry to control the threshold voltages.

SUMMARY

A memory device includes an array of strings of memory cells. The device includes a plurality of stacks of conductive strips separated by insulating material, including at least a bottom plane (GSL) of conductive strips, a plurality of intermediate planes (WLs) of conductive strips, and a top plane of conductive strips (SSLs). A plurality of vertical active strips is disposed between the plurality of stacks. Charge storage structures are disposed in interface regions at cross-points between side surfaces of the conductive strips in the plurality of intermediate planes in the stacks and the vertical active strips in the plurality of vertical active strips. Gate dielectric, having a different composition than the charge storage structures, is disposed in interface regions at cross-points between the vertical active strips in the plurality of vertical active strips and side surfaces of the conductive strips in at least one of the top plane of conductive strips and the bottom plane of conductive strips.

The device can include silicide formations on the top plane of conductive strips (SSLs). The device can include spacers to isolate the vertical active strips from the top plane of conductive strips, and silicide formations on top of the vertical active strips. The gate dielectric can include a layer of silicon oxide material thinner than the charge storage structures. The gate dielectric can have a thickness of about seven (7) nanometers.

A reference conductor is disposed in a level between the bottom plane of conductive strips and the integrated circuit substrate, and connected to the plurality of vertical active strips. The reference conductor can include N+ doped semiconductor material.

Methods for manufacturing memory devices as described herein are also provided.

Other aspects and advantages of the present invention can be seen on review of the drawings, the detailed description and the claims, which follow.

DETAILED DESCRIPTION

Figure 1:
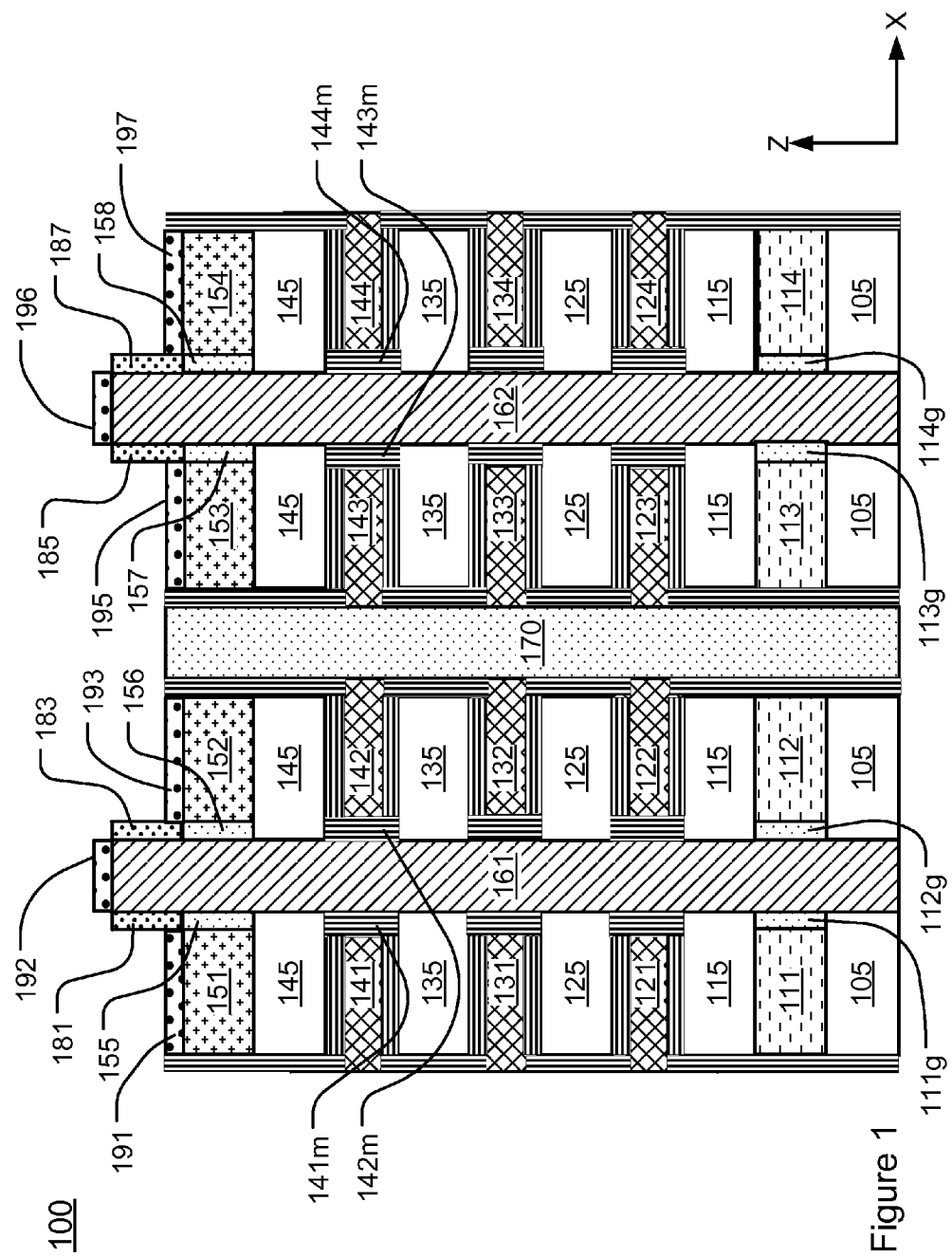
FIG. 1 is a cross-sectional diagram of a 3D memory device according to an embodiment of the present invention.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a cross-sectional diagram of a 3D memory device 100 according to an embodiment of the present invention, shown in an X-Z plane. As illustrated in the example of FIG. 1, a memory device 100 includes an array of NAND strings of memory cells formed on an integrated circuit substrate. The device includes a plurality of stacks of conductive strips separated by insulating material (e.g. 105, 115, 125, 135, 145), including at least a bottom plane (GSL) of conductive strips (e.g. 111-114), a plurality of intermediate planes (WLs) of conductive strips (e.g. 121-124, 131-134, 141-144), and a top plane (SSLs) of conductive strips (e.g. 151-154). A plurality of vertical active strips (e.g. 161, 162) is disposed between the plurality of stacks. Charge storage structures (e.g. 141m, 142m, 143m, 144m) are disposed in interface regions at cross-points between side surfaces of the conductive strips in the plurality of intermediate planes in the stacks and the vertical active strips in the plurality of vertical active strips. Insulating material (e.g. 170) separates a stack of conductive strips (e.g. 112, 122, 132, 142, 152) from an adjacent stack of conductive strips (e.g. 113, 123, 133, 143, 153).

Gate dielectric (e.g. 111g, 112g, 113g, 114g, 155-158) is disposed in interface regions at cross-points between the vertical active strips and side surfaces of the conductive strips in at least one of the top plane of conductive strips and the bottom plane of conductive strips, thereby forming string select lines (SSL) and ground select lines (GSL). Gate dielectric (e.g. 111g, 112g, 113g, 114g, 155-158) has a different composition than the charge storage structures. String select lines (SSL) and ground select lines (GSL) formed with gate dielectric are not chargeable and thus have fixed threshold voltages.

The gate dielectric can include a layer of silicon oxide material thinner than the charge storage structures. For instance, the gate dielectric can have a thickness of about seven (7) nanometers, while the charge storage structures can have a thickness of about twenty (20) nanometers. String select lines (SSL) and reference select switches formed with the gate dielectric can operate at a lower voltage (e.g. 3.3V) than the voltage required to operate memory cells formed with charge storage structures (e.g. about 5V to about 20V).

The device can include silicide formations on the top plane of conductive strips (e.g. 191, 193, 195, 197) to reduce resistance of the conductive strips in the top plane. The device can include spacers (e.g. 181, 183, 185, 187) to isolate the vertical active strips from the top plane of conductive strips, and silicide formations (e.g. 192, 196) on top of the vertical active strips.

The conductive strips in the plurality of stacks of conductive strips are disposed in a Y direction perpendicular to the X-Z plane, and are connected to decoding circuitry in the memory device. A reference conductor (not shown) can be disposed in a level between the bottom plane of conductive strips and the integrated circuit substrate, and connected to the plurality of vertical active strips. The reference conductor can include N+ doped semiconductor material. The memory device can include an overlying patterned conductive layer (not shown) connected to the plurality of vertical active strips, including a plurality of global bit lines coupled to sensing circuits.

Figure 1A:
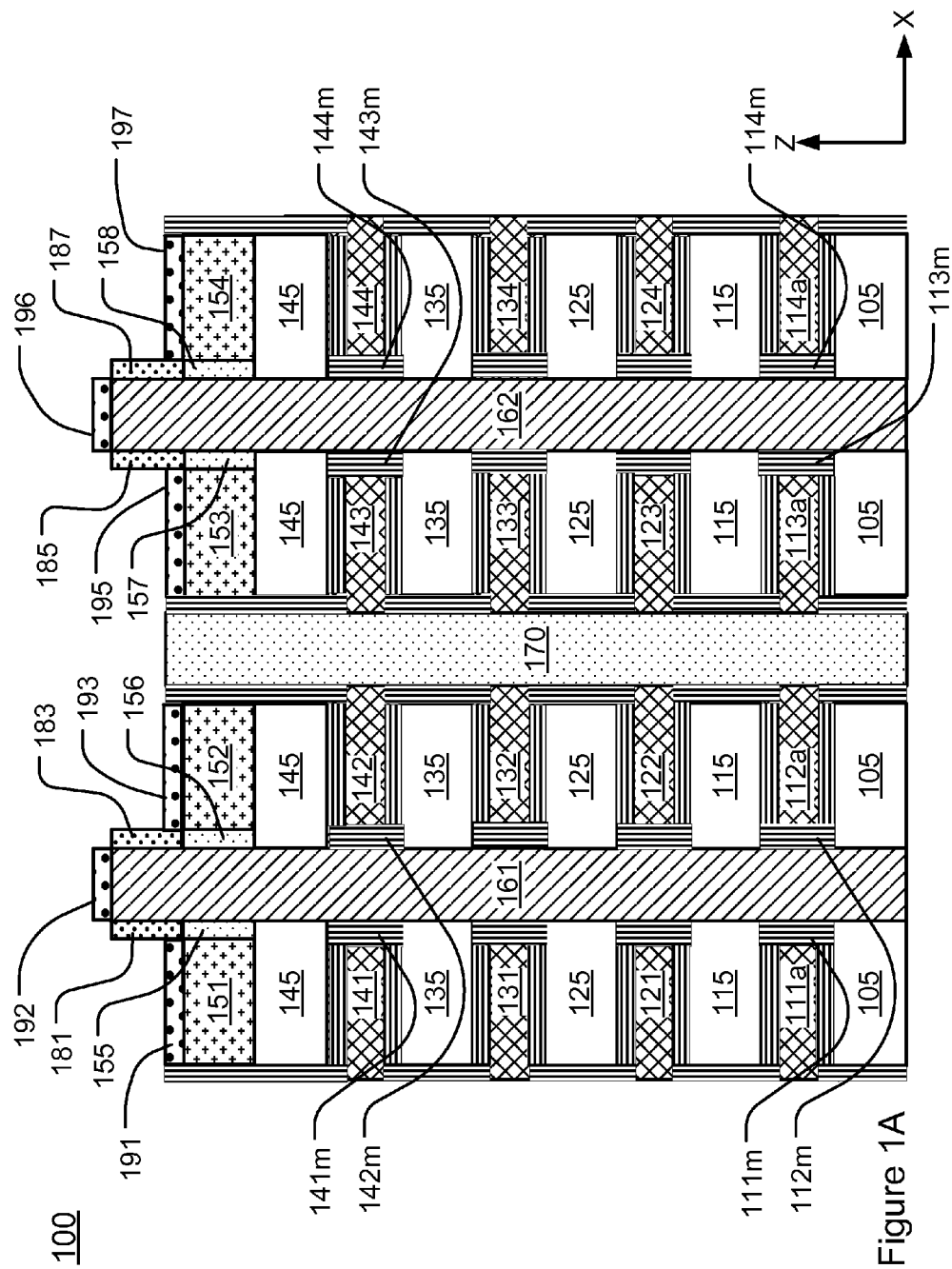
FIG. 1A is a cross-sectional diagram of a 3D memory device according to an alternative embodiment of the present invention.

FIG. 1A is a cross-sectional diagram of a 3D memory device according to an alternative embodiment of the present invention. The difference in the alternative embodiment is that gate dielectric is disposed only in interface regions at cross-points between the vertical active strips in the plurality of vertical active strips and side surfaces of the conductive strips in the top plane of conductive strips (e.g. 155-158). Charge storage structures (e.g. 111m, 112m, 113m, 114m) are disposed in interface regions at cross-points between the vertical active strips in the plurality of vertical active strips and side surfaces of the conductive strips in the bottom plane of conductive strips.

Figure 1B:
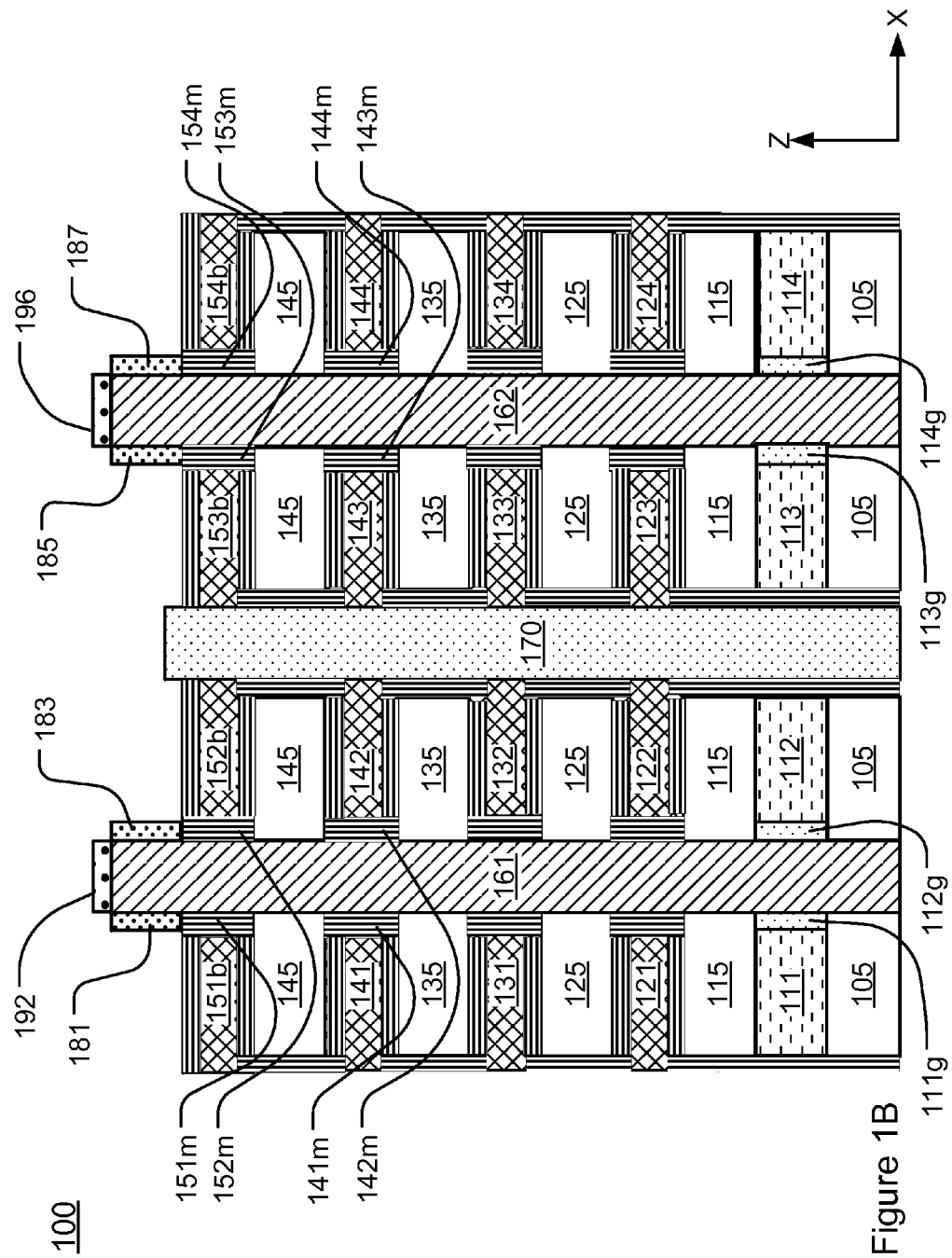
FIG. 1B is a cross-sectional diagram of a 3D memory device according to a second alternative embodiment of the present invention.

FIG. 1B is a cross-sectional diagram of a 3D memory device according to a second alternative embodiment of the present invention. One difference in the second alternative embodiment is that gate dielectric is disposed only in interface regions at cross-points between the vertical active strips in the plurality of vertical active strips and side surfaces of the conductive strips in the bottom plane of conductive strips (e.g. 111g, 112g, 113g, 114g). Charge storage structures (e.g. 151m, 152m, 153m, 154m) are disposed in interface regions at cross-points between the vertical active strips in the plurality of vertical active strips and side surfaces of the conductive strips in the top plane of conductive strips. Another difference in the second alternative embodiment is that silicide formations (e.g. 192, 196) are formed only on top of the vertical active strips in 161, 162), but not on the charge storage structures (e.g. 151m, 152m, 153m, 154m), while in the embodiments as illustrated in FIGS. 1 and 1A, silicide formations (e.g. 191, 193, 195, 197) are also formed on the top plane (SSLs) of conductive strips (e.g. 151-154) which can include poly silicon.

Figure 2:
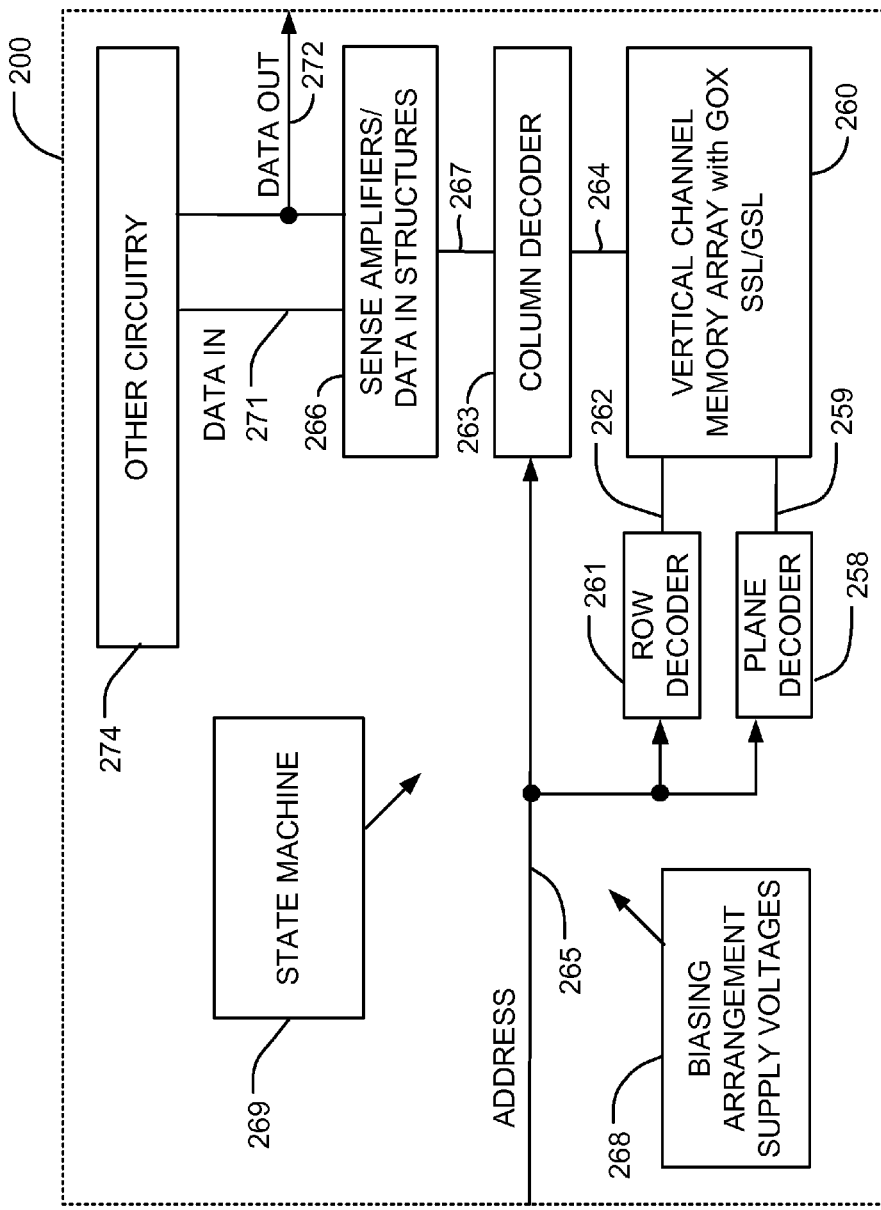
FIG. 2 is a simplified block diagram of an integrated circuit according to an embodiment of the present invention.

FIG. 2 is a simplified block diagram of an integrated circuit according to an embodiment of the present invention. In the example shown in FIG. 2, the integrated circuit 200 includes a vertical channel memory array 260 implemented with gate dielectric on at least one of the top plane of conductive strips (SSLs) and the bottom plane of conductive strips (GSL), as described herein, on a integrated circuit substrate. The gate dielectric has a different composition than the charge storage structures implemented on the conductive strips in the plurality of intermediate planes (WLs).

A row decoder 261 is coupled to a plurality of word lines 262, and arranged along rows in the memory array 260. A column decoder 263 is coupled to a plurality of bit lines 264 (or SSL lines as described above) arranged along columns in the memory array 260 for reading and programming data from the memory cells in the memory array 260. A plane decoder 258 is coupled to a plurality of planes in the memory array 260 on SSL lines 259 (or bit lines as described above). Addresses are supplied on bus 265 to column decoder 263, row decoder 261 and plane decoder 258. Sense amplifiers and data-in structures in block 266 are coupled to the column decoder 263 in this example via data bus 267. Data is supplied via the data-in line 271 from input/output ports on the integrated circuit 275 or from other data sources internal or external to the integrated circuit 275, to the data-in structures in block 266. In the illustrated embodiment, other circuitry 274 is included on the integrated circuit, such as a general purpose processor or special purpose application circuitry, or a combination of modules providing system-on-a-chip functionality supported by the programmable resistance cell array. Data is supplied via the data-out line 272 from the sense amplifiers in block 266 to input/output ports on the integrated circuit 275, or to other data destinations internal or external to the integrated circuit 275.

A controller implemented in this example using bias arrangement state machine 269 controls the application of bias arrangement supply voltage generated or provided through the voltage supply or supplies in block 268, such as read and program voltages. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

Figure 3:
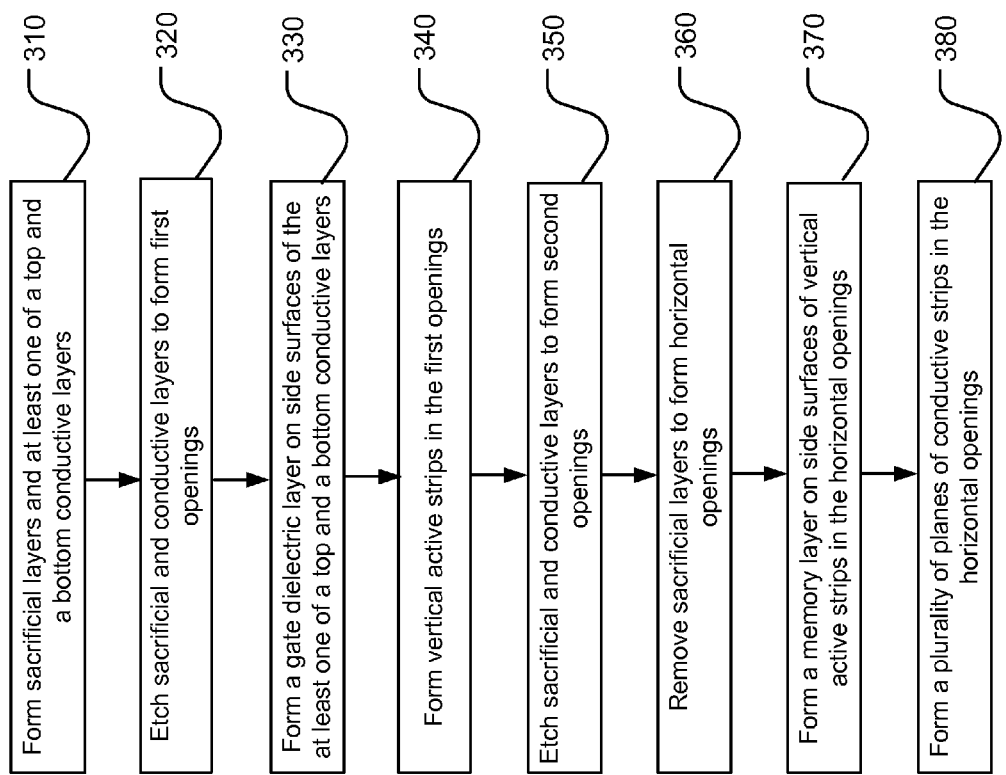
FIG. 3 is a flow chart illustrating a method for manufacturing a memory device.

FIG. 3 is a flow chart illustrating a method for manufacturing a vertical channel structure. The method begins with forming a plurality of sacrificial layers, and at least one of a top conductive layer and a bottom conductive layer, separated by insulating layers on an integrated circuit substrate (Step 310). The sacrificial and conductive layers are etched to form first openings (Step 320). A gate dielectric layer is formed on side surfaces of the at least one of a top conductive layer and a bottom conductive layer in the first openings (Step 330). A plurality of vertical active strips are formed in the first openings, where vertical active strips in the plurality of vertical active strips contact the gate dielectric layer (Step 340).

The sacrificial and conductive layers are then etched to form second openings between adjacent vertical active strips in the plurality of vertical active strips, thereby exposing the plurality of sacrificial layers, and thereby forming at least one of a top plane of conductive strips and a bottom plane of conductive strips in the at least one of a top conductive layer and a bottom conductive layer (Step 350). The plurality of sacrificial layers exposed by the second openings are removed to form horizontal openings between the insulating layers (Step 360). A memory layer is formed on side surfaces of the vertical active strips in the horizontal openings (Step 370). A plurality of planes of conductive strips is formed in the horizontal openings. Side surfaces of conductive strips in the plurality of planes contact the memory layer (Step 380). The plurality of planes includes a plurality of intermediate planes (WLs) of conductive strips. The plurality of planes can include one of a top plane of conductive strips (SSL) that contacts the memory layer, as shown in FIG. 1B, and a bottom plane of conductive strips (GSL) that contacts the memory layer, as shown in FIG. 1A. Insulating material is then formed in the second openings.

The gate dielectric layer has a different composition than the memory layer. The gate dielectric layer can include silicon oxide. The memory layer can include a multilayer dielectric charge storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

The gate dielectric can include a layer of silicon oxide material thinner than the memory layer. For instance, the gate dielectric layer can have a thickness of about seven (7) nanometers, while the memory layer can have a thickness of twenty (20) nanometers.

Spacers can be formed on sides of the vertical active strips to isolate the vertical active strips from the top plane of conductive strips. Silicide formations can be formed on top of the vertical active strips. Silicide formations can be formed on the top plane of conductive strips, for example, during a same process step that silicide formations are formed on top of the vertical active strips.

In one implementation, both the top plane of conductive strips and the bottom plane of conductive strips can have side surfaces contacting the gate dielectric layer. In another implementation, the top plane of conductive strips can have side surfaces contacting the gate dielectric layer, while the bottom plane of conductive strips can have side surfaces contacting the memory layer. In yet another implementation, the top plane of conductive strips can have side surfaces contacting the memory layer, while the bottom plane of conductive strips can have side surfaces contacting the gate dielectric layer.

The method can further include forming a reference conductor in a level between the plurality of sacrificial and conductive layers and the integrated circuit substrate, where the reference conductor is connected to the plurality of vertical active strips. The reference conductor can include N+ doped semiconductor material.

Figure 4:
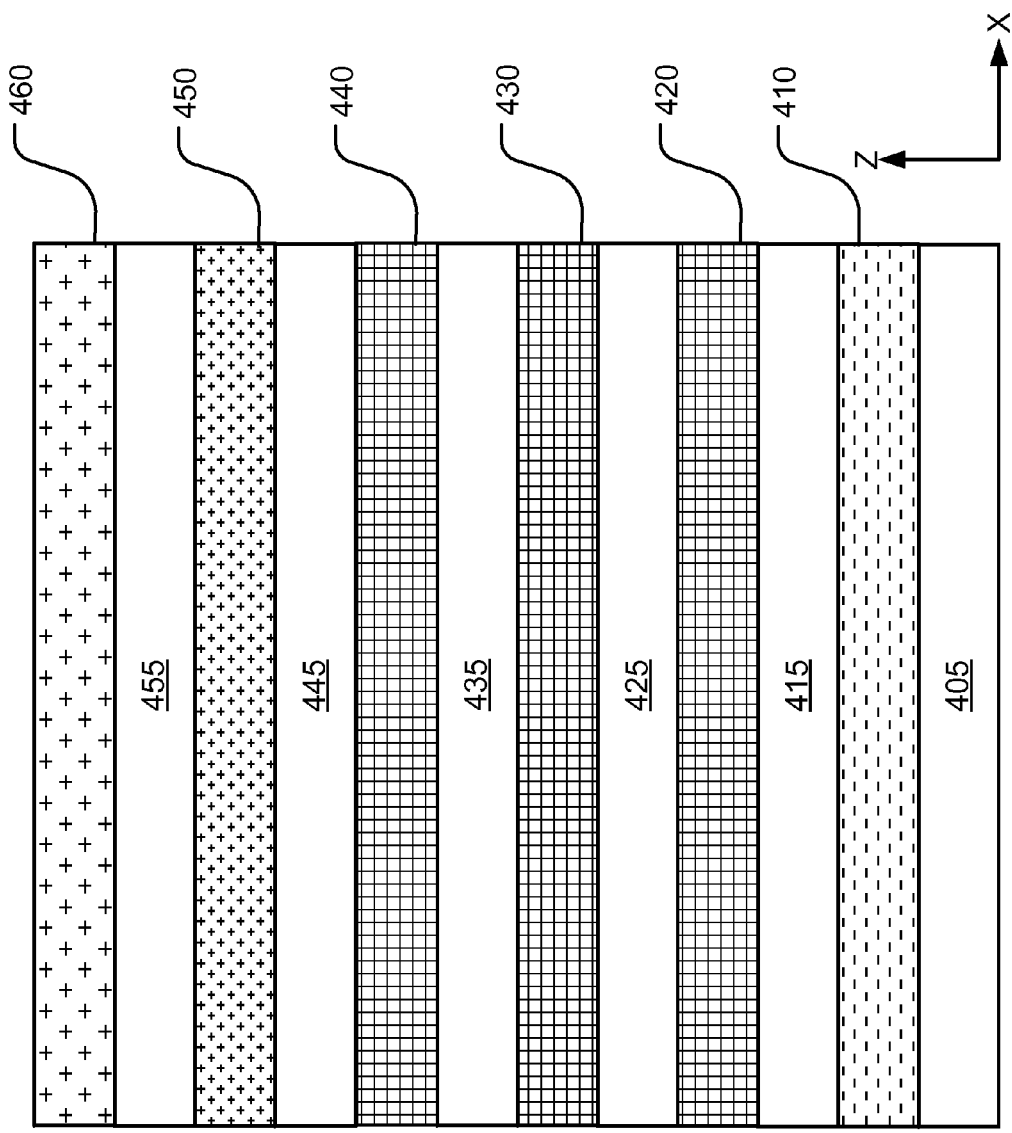
FIGS. 4 through 15 illustrate an example process flow for manufacturing a memory device.

FIGS. 4 through 15 illustrate an example process flow for manufacturing a memory device. FIG. 4 illustrates a cross-section in the X-Z plane of a partially fabricated memory device. In the example shown in FIG. 4, the memory device includes a plurality of sacrificial layers (e.g. 420, 430 and 440) for forming word lines (WLs), a top conductive layer (e.g. 450) for forming string select lines (SSL), and a bottom conductive layer (e.g. 410) for ground select lines (GSL), on an integrated circuit substrate. The sacrificial and conductive layers are separated by insulating layers (e.g. 405, 415, 425, 435, 445, 455). The plurality of sacrificial layers can include silicon nitride. The top conductive layer (e.g. 450) and the bottom conductive layer (e.g. 410) can include N+ poly silicon.

A hard mask (e.g. 460) is disposed on the sacrificial and conductive layers for patterning the sacrificial and conductive layers. The hard mask can include poly silicon, which is highly selective to the silicon nitride material used in the sacrificial layers, and to the oxide material used in the insulation layers.

Figure 5:
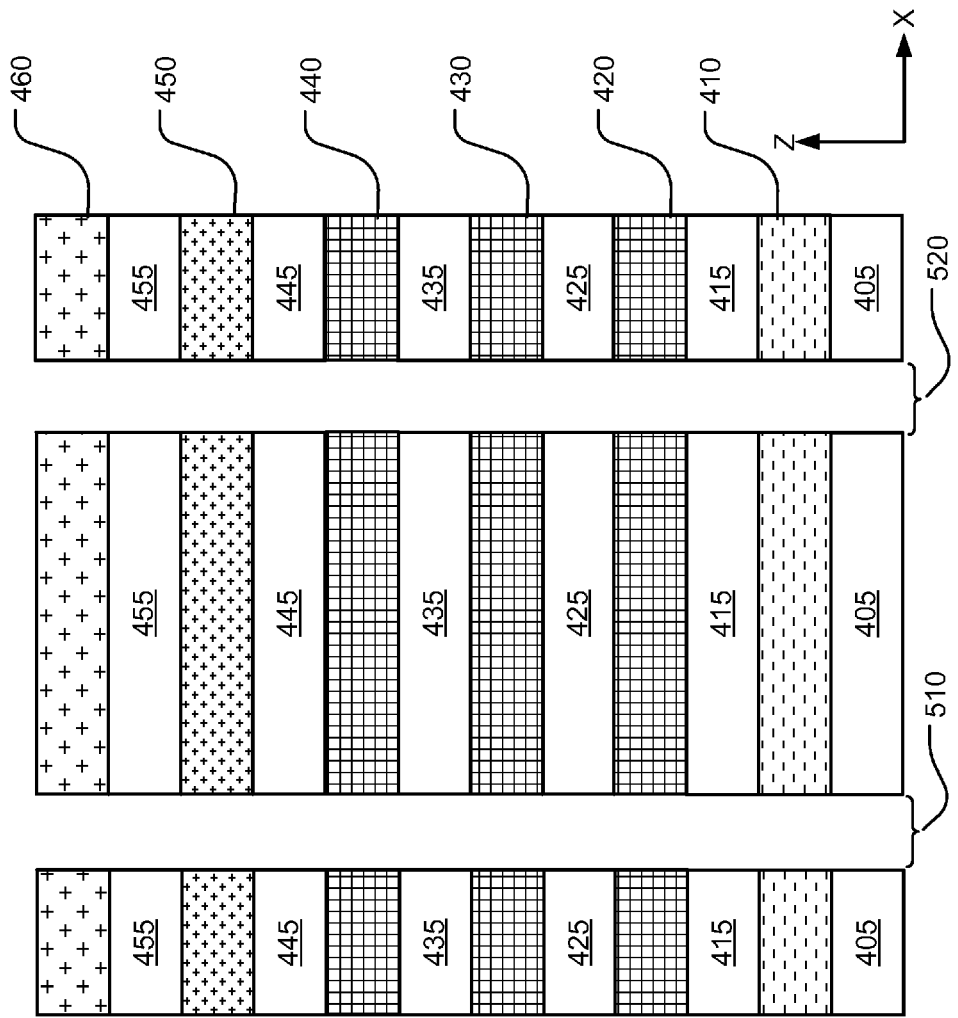

FIG. 5 illustrates a stage in the process after etching the sacrificial and conductive layers using the hard mask to form first openings (e.g. 510, 520). For instance, the sacrificial and conductive layers can be etched with RIE (reactive ion etching). The first openings are etched through the plurality of sacrificial layers (e.g. 420, 430 and 440), the top conductive layer (450), and the bottom conductive layer (410). The first openings are used to form a plurality of vertical active strips.

Figure 6:
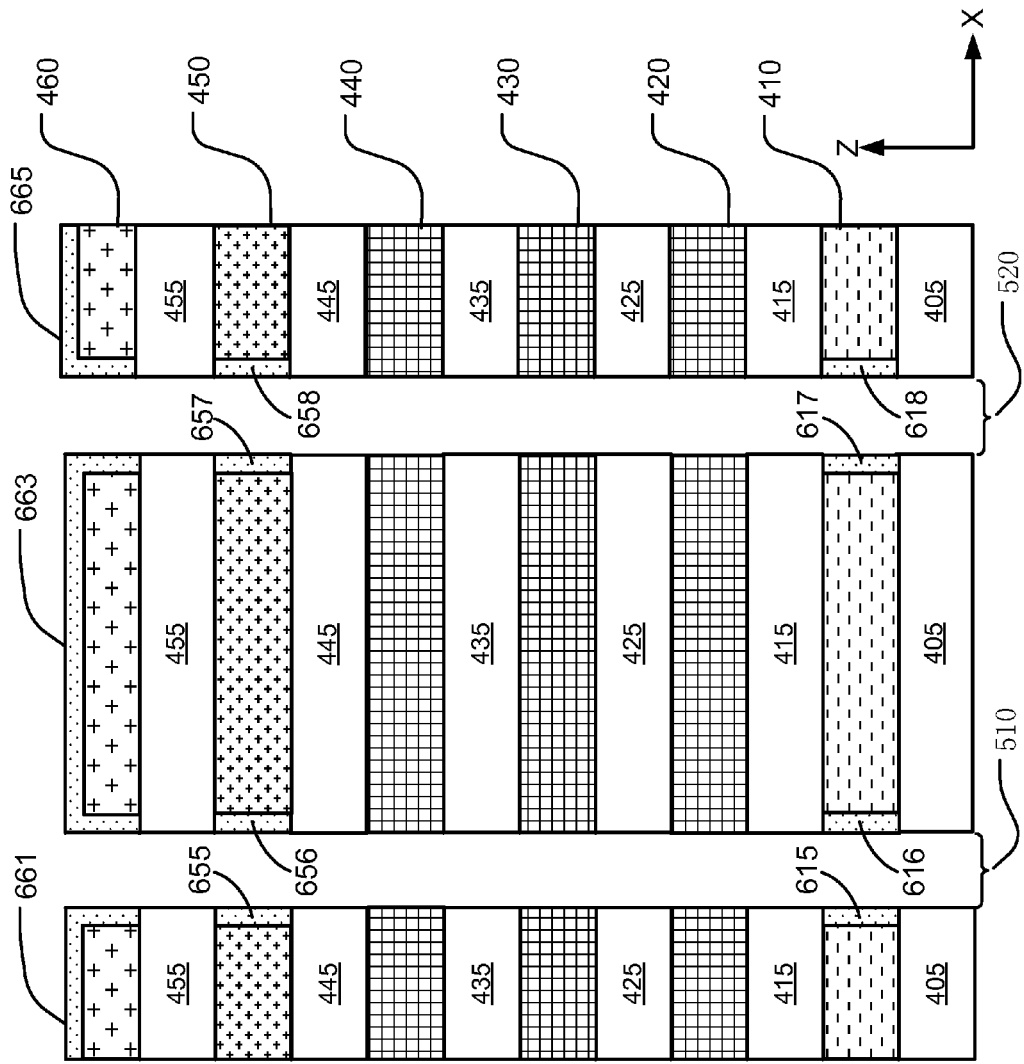

FIG. 6 illustrates a stage in the process after forming a gate dielectric layer on side surfaces of the top conductive layer (e.g. 655, 656, 657, 658), and on side surfaces of the bottom conductive layer (e.g. 615, 616, 617, 618) in the first openings (e.g. 510, 520). The gate dielectric layer can include a layer of silicon oxide material. The gate dielectric layer has a thickness of about seven (7) nanometers. The layer of silicon oxide material can be formed by thermal oxidation on the top conductive layer (e.g. 450) and the bottom conductive layer (e.g. 410) at a range of temperature between 800° C.-900° C. As a result of the thermal oxidation, the layer of silicon oxide material (e.g. 661, 663, 665) also forms on the hard mask (e.g. 460). The layer of silicon oxide material does not form on the plurality of sacrificial layers (e.g. 420, 430 and 440).

Figure 7:
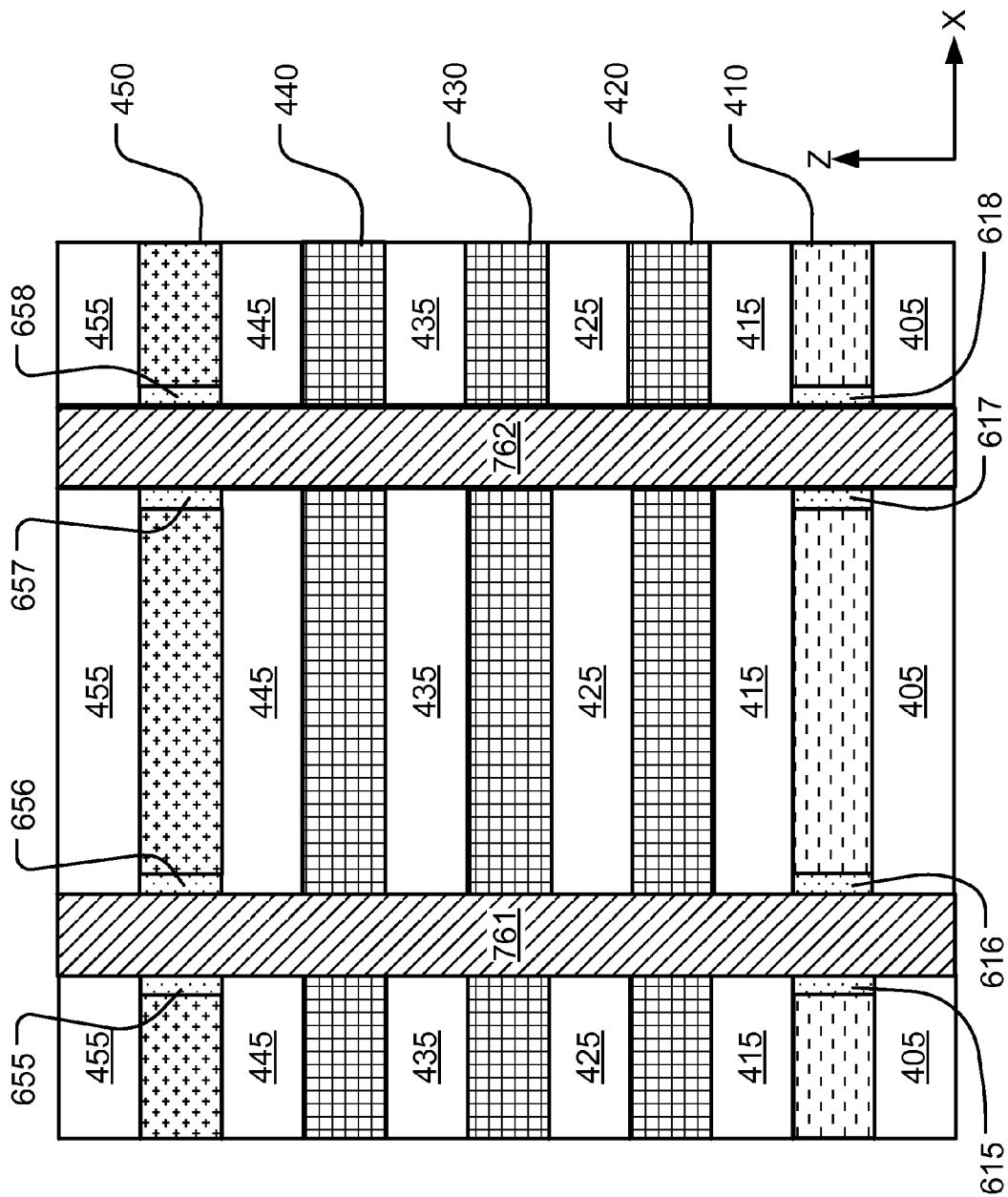

FIG. 7 illustrates a stage in the process after forming a plurality of vertical active strips (e.g. 761, 762) in the first openings. The vertical active strips contact the gate dielectric layer formed on side surfaces of the top conductive layer (e.g. 655, 656, 657, 658), and on side surfaces of the bottom conductive layer (e.g. 615, 616, 617, 618). The plurality of vertical active strips can extend to a reference conductor layer (not shown) below the sacrificial and conductive layers. The hard mask (e.g. 460) is planarized, for instance using CMP (chemical-mechanical-planarization), stopping at an insulation layer (e.g. 455) below the hard mask.

Figure 8:
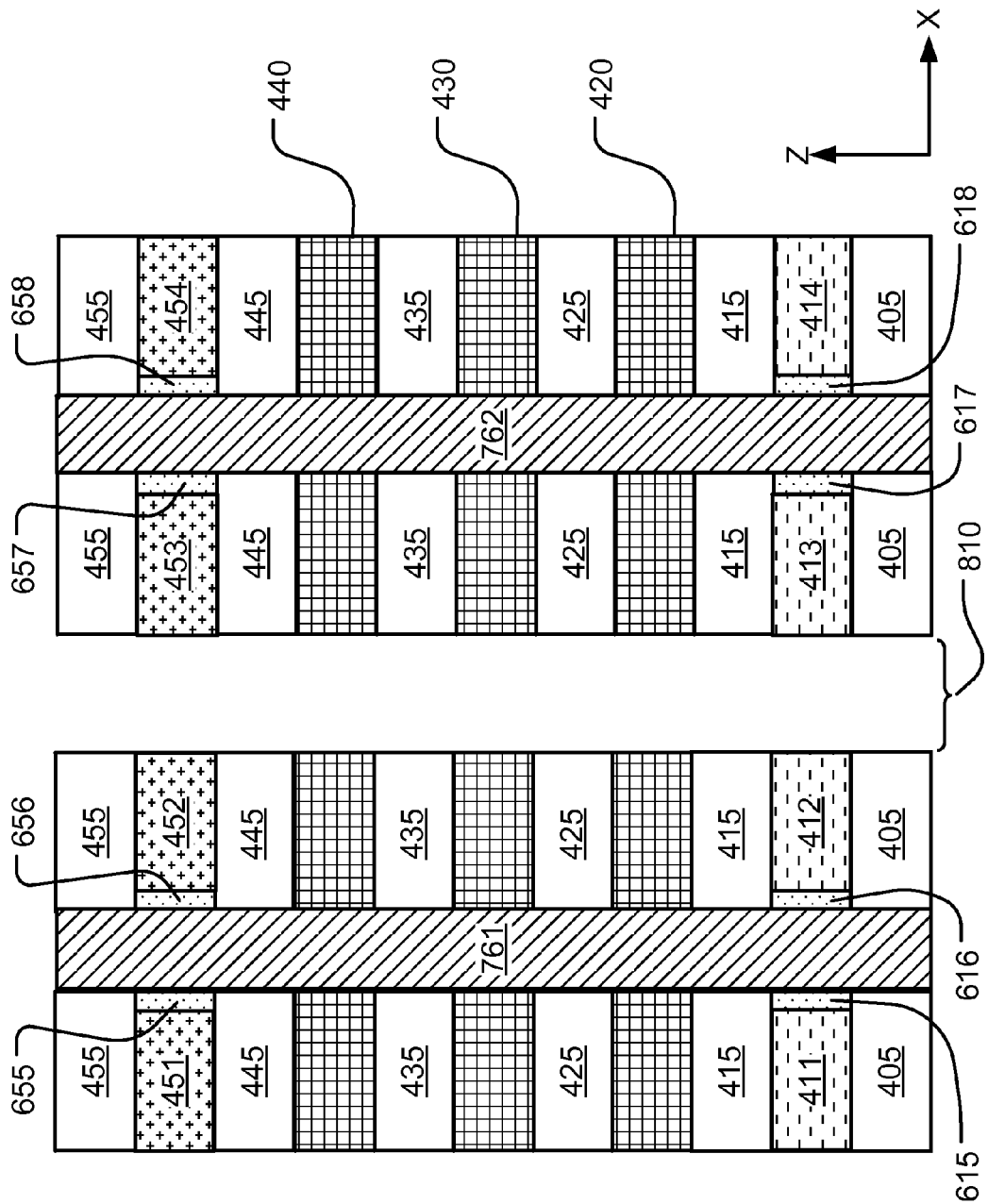

FIG. 8 illustrates a stage in the process after etching the sacrificial and conductive layers to form second openings (e.g. 810) between adjacent vertical active strips (e.g. 761, 762) in the plurality of vertical active strips. The plurality of sacrificial layers (e.g. 420, 430, 440) is exposed by the second openings. A top plane of conductive strips (e.g. 451-454), and a bottom plane of conductive strips (e.g. 411-414) are formed, where conductive strips in the top plane and the bottom plane contact the gate dielectric layer (e.g. 655-658, 615-618). Conductive strips in the top plane and in the bottom plane are in a Y direction perpendicular to the X-Z plane.

Figure 9:
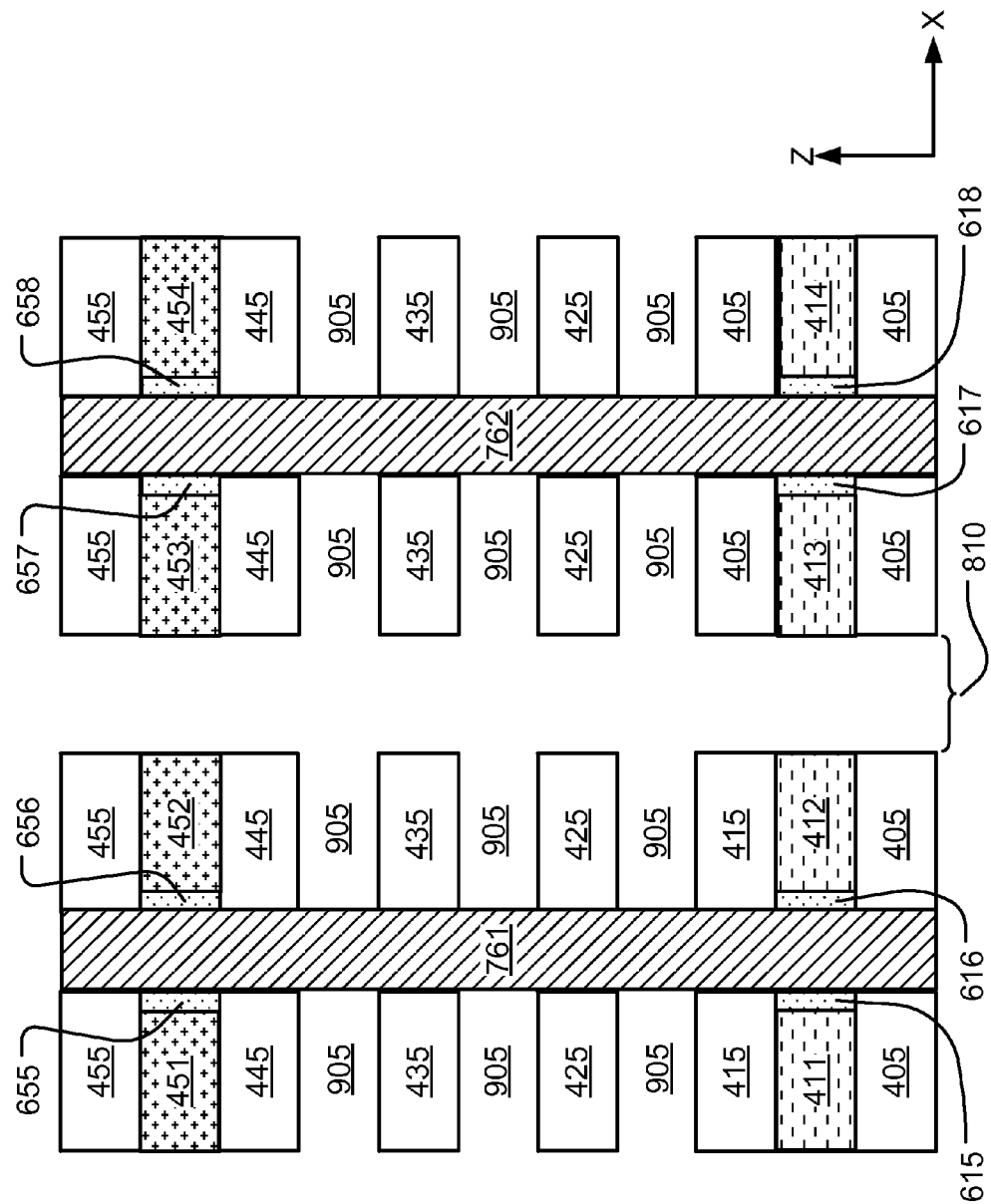

FIG. 9 illustrates a stage in the process after removing the plurality of sacrificial layers exposed by the second openings to form horizontal openings (e.g. 905) between the insulating layers (e.g. 415, 425, 435, 445). This stage in the process leaves the insulating layers adhered to the vertical active strips (e.g. 761, 762), with horizontal openings (e.g. 905) in between. Horizontal openings 905 can be used for forming word lines (WLs). The plurality of sacrificial layers can be removed by an etching process using phosphoric acid (H3PO4) as an etchant. Phosphoric acid (H3PO4) is highly selective to the silicon nitride material used in the sacrificial layers, to the oxide material used in the insulation layers, and to the N+ poly silicon material used in the top conductive layer and in the bottom conductive layer.

Figure 10:
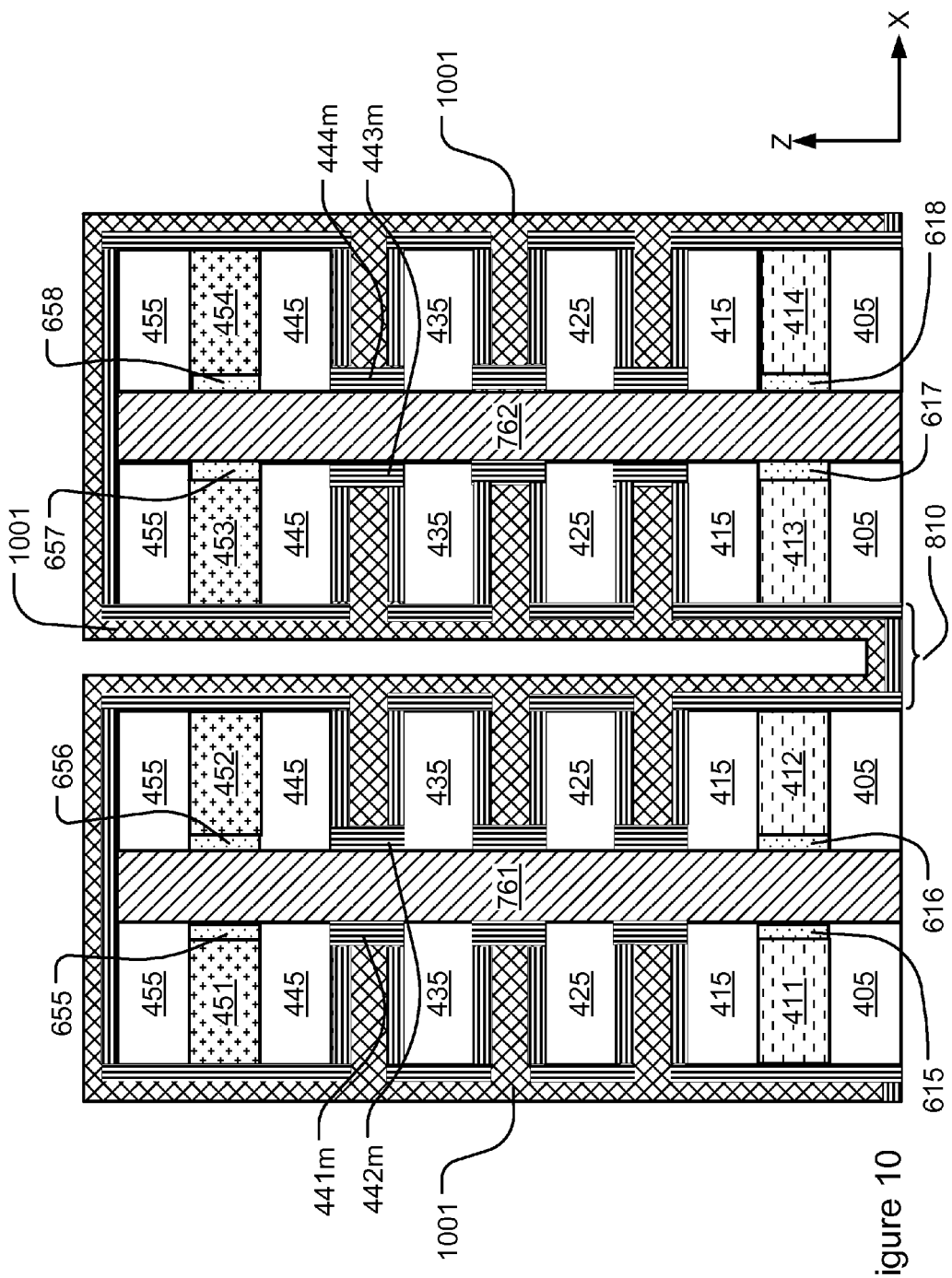

FIG. 10 illustrates a stage in the process after forming a memory layer (e.g. 441m, 442m, 443m, 444m) on side surfaces of the vertical active strips in the horizontal openings, and then depositing a conductive material (e.g. 1001) over the memory layer, through the second openings (e.g. 810). The conductive material can include TiN (titanium nitride) and W (tungsten). Excess conductive material may remain on walls of the second openings.

Figure 11:
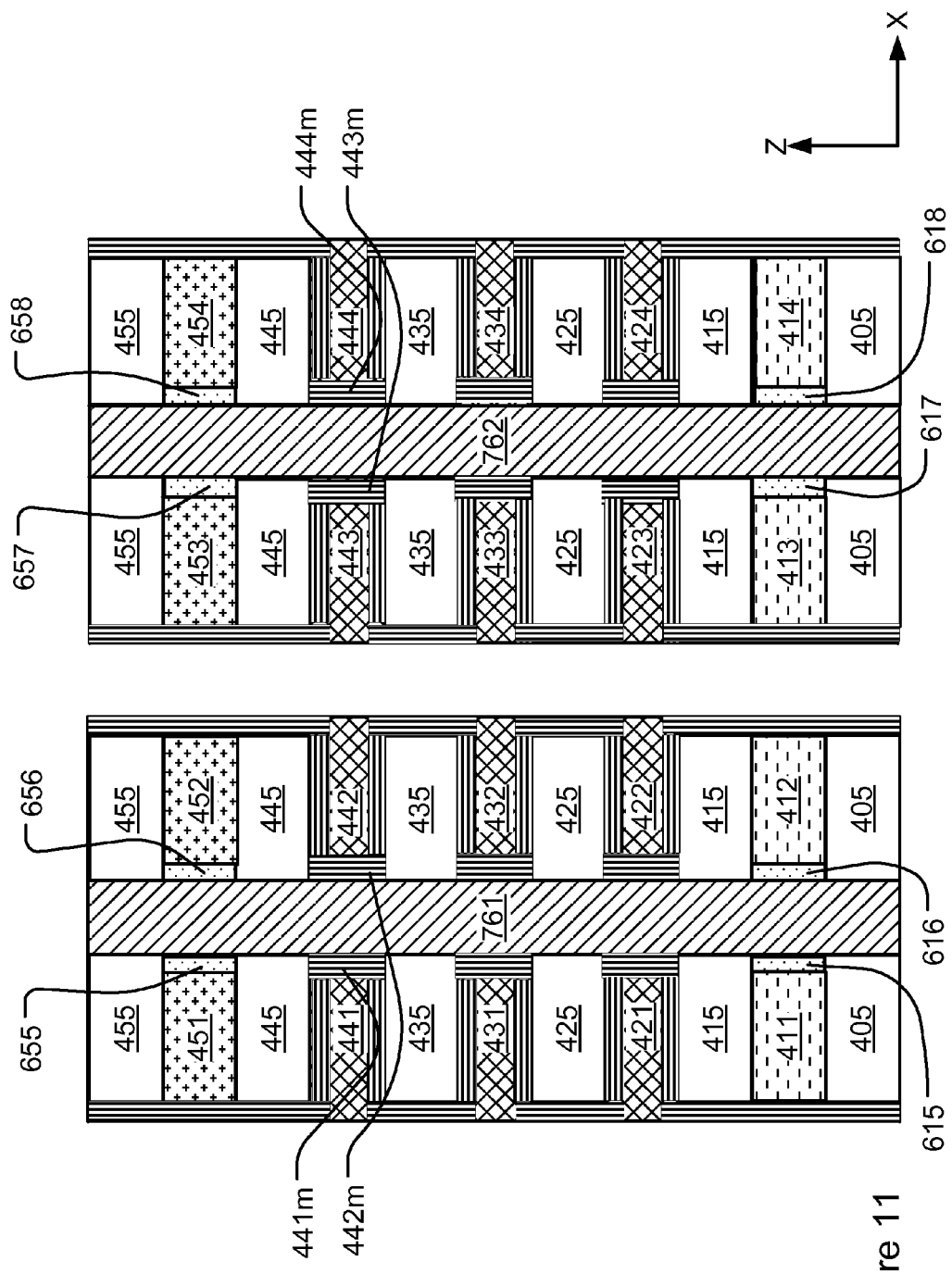

FIG. 11 illustrates a stage in the process after removing the excess conductive material remaining on the walls of the second openings, for example using an iso-tropical etch. The removal leaves the conductive material only in the horizontal openings. At this stage in the process, a plurality of planes of conductive strips is formed in the horizontal openings. The plurality of planes includes a plurality of intermediate planes (WLs) of conductive strips (e.g. 421-424, 431-434, 441-444), and side surfaces of conductive strips in the intermediate planes contact the memory layer. Conductive strips in the plurality of planes are in a Y direction perpendicular to the X-Z plane.

Figure 12:
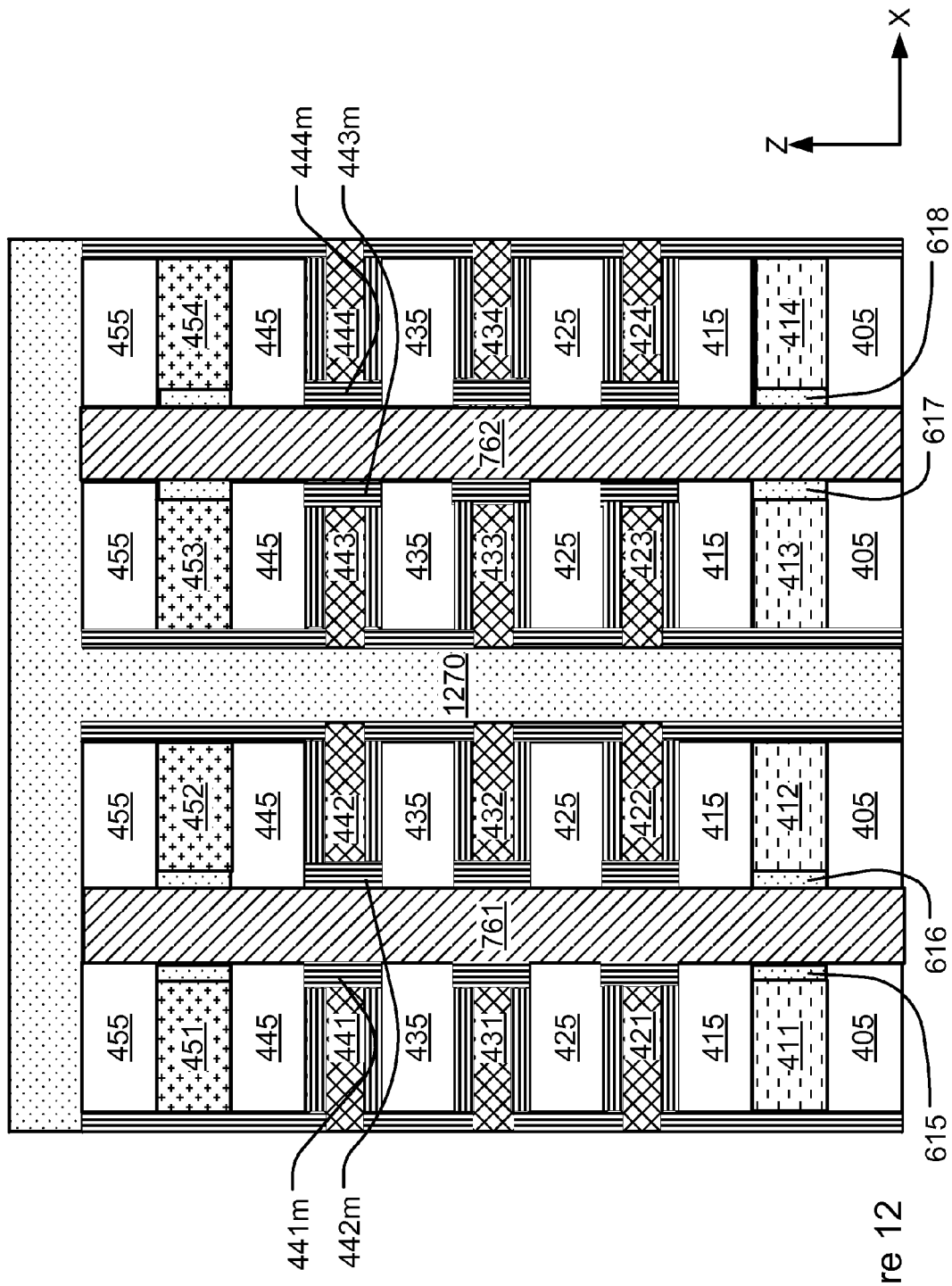

FIG. 12 illustrates a stage in the process after forming insulating material (e.g. 1270) in the second openings (e.g. 810) and over a top insulating layer (e.g. 455).

Figure 13:
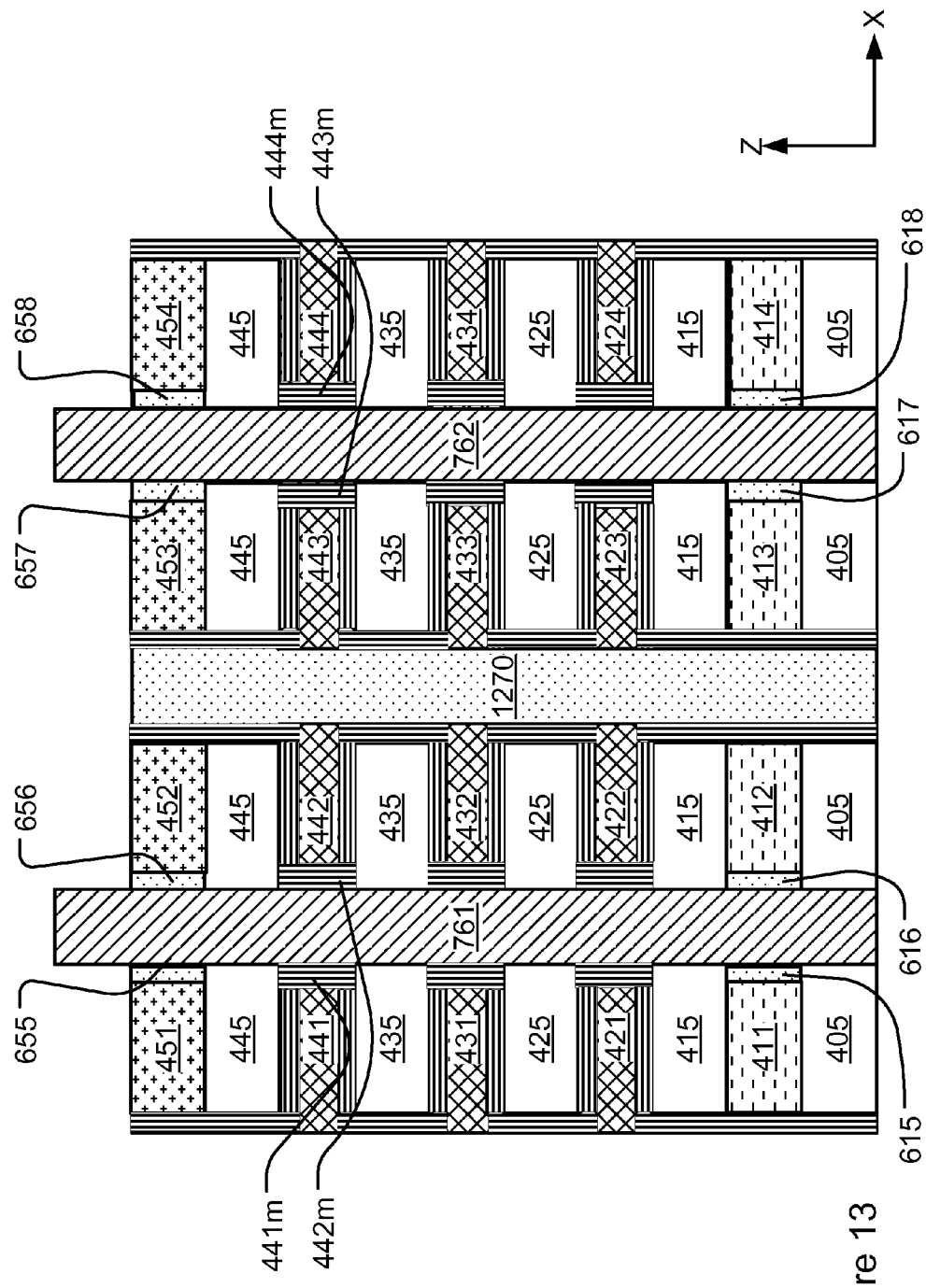

FIG. 13 illustrates a stage in the process after etching insulating materials (e.g. 1270, 455) to stop on the top plane of conductive strips (e.g. 451-454), and on top of the vertical active strips (e.g. 761, 762). At this stage in the process, a plurality of stacks of conductive strips is formed. Each stack of conductive strips includes a bottom plane (GSL) of conductive strips (e.g. 411, 412, 413, 414), a plurality of intermediate planes (WLs) of conductive strips (e.g. 441, 442, 443, 444), and a top plane (SSL) of conductive strips (e.g. 451, 452, 453, 454). Gate dielectric (e.g. 615-618, 655-658) is formed in interface regions at cross-points between the vertical active strips in the plurality of vertical active strips and side surfaces of the conductive strips in the top plane of conductive strips and the bottom plane of conductive strips.

Figure 14:
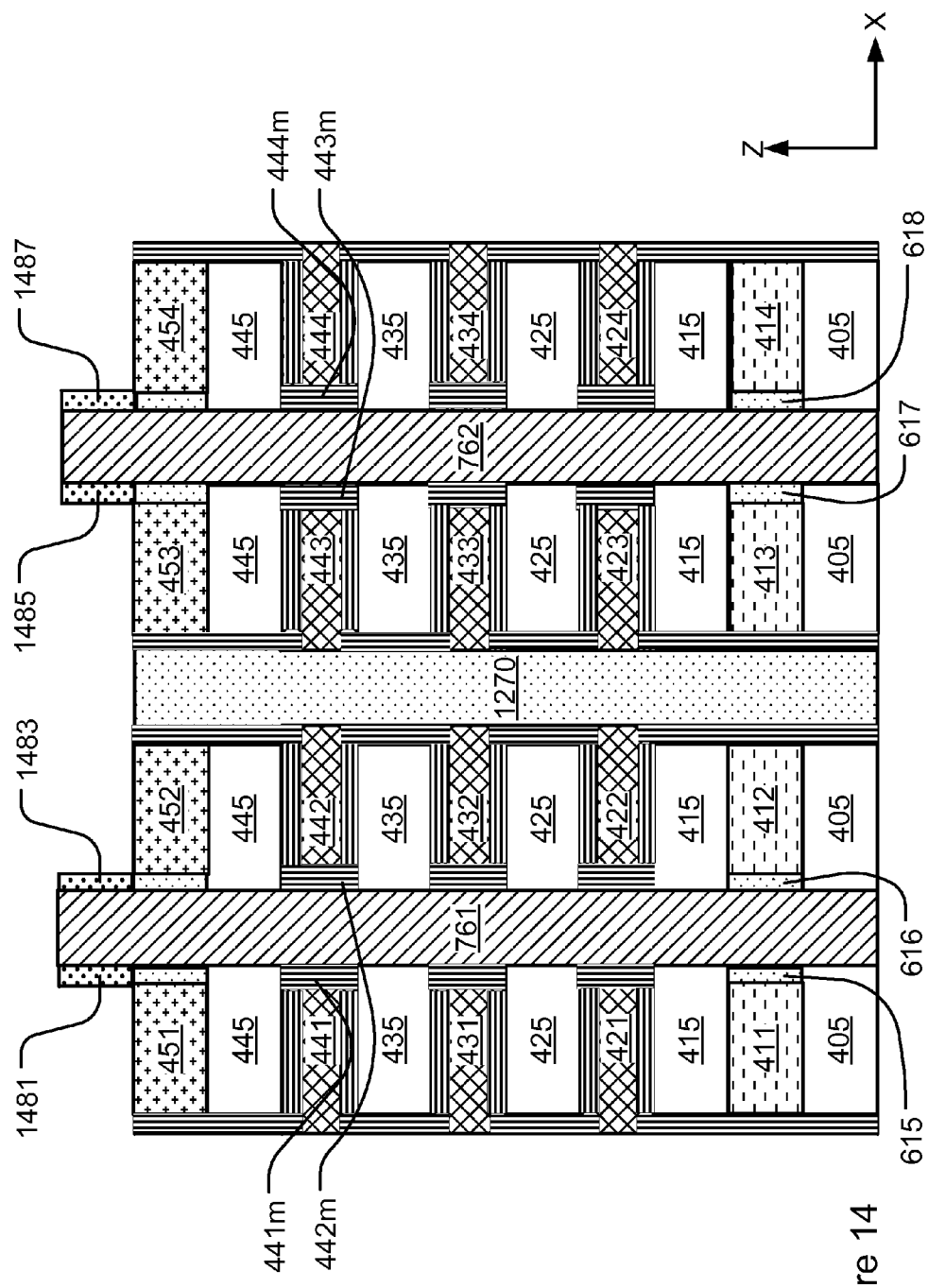

FIG. 14 illustrates a stage in the process after forming spacers (e.g. 1481, 1483, 1485, 1587) to isolate the vertical active strips (e.g. 761, 762) from the top plane of conductive strips (e.g. 451-454). The spacers can be thin dielectric liners and can include oxide or silicon nitride materials.

Figure 15:
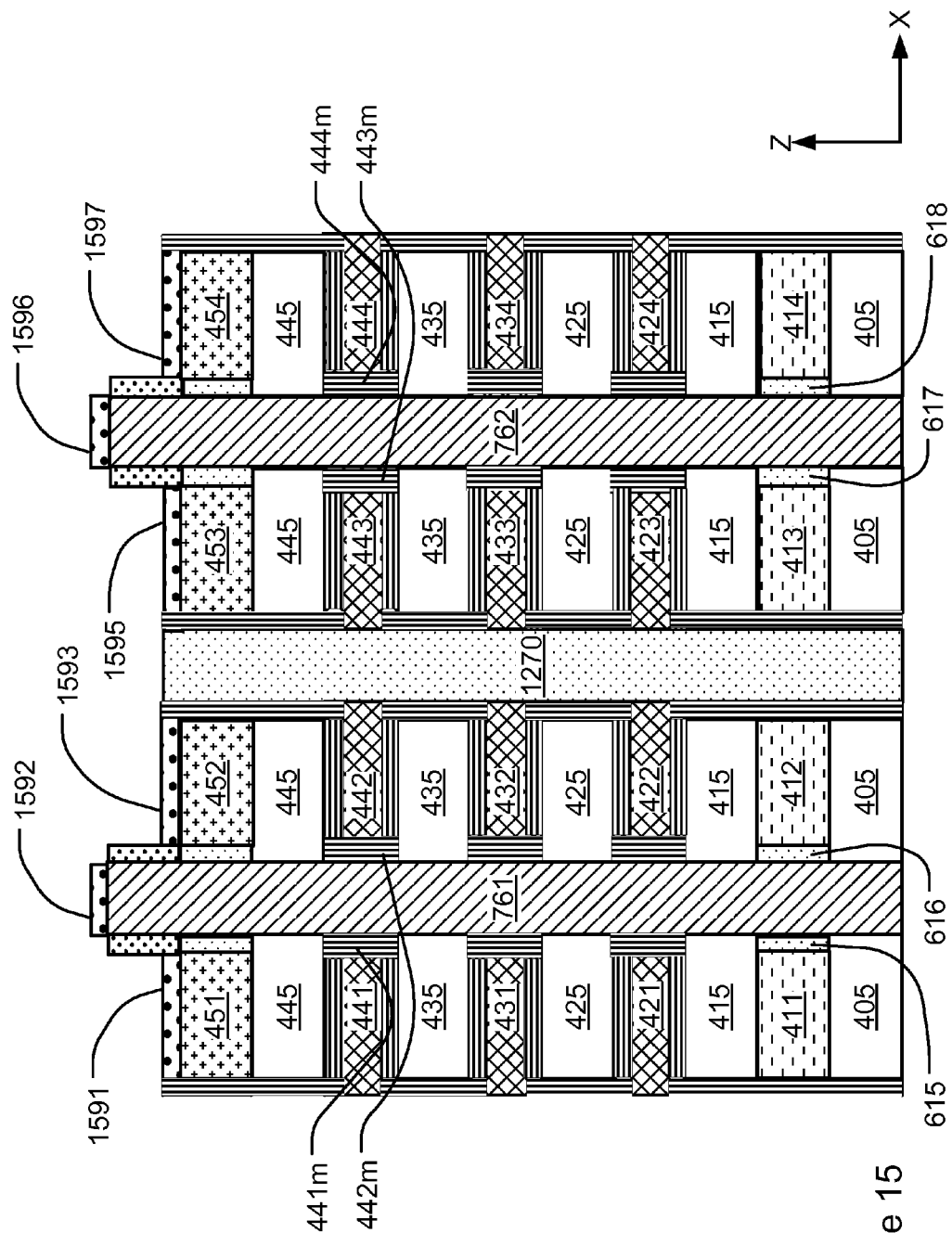

FIG. 15 illustrates a stage in the process after forming silicide formations (e.g. 1591, 1593, 1595, 1597) on the top plane of conductive strips (e.g. 451-454), and/or forming silicide formations (e.g. 1592, 1596) on top of the vertical active strips (e.g. 761, 762). The silicide formations can include Ti (titanium), Co (cobalt) and Ni (nickel). The manufacturing process continues to complete a 3D memory array.

FIGS. 16 through 27 illustrate an alternative example process flow for manufacturing a memory device. The example process flow illustrated in FIGS. 4-15 results in a memory device including gate dielectric in interface regions at cross-points between the vertical active strips in the plurality of vertical active strips and side surfaces of the conductive strips in the top plane of conductive strips and the bottom plane of conductive strips. In comparison, the alternative example process flow illustrated in FIGS. 16-27 results in a memory device including gate dielectric in interface regions at cross-points between the vertical active strips in the plurality of vertical active strips and side surfaces of the conductive strips only in the top plane of conductive strips. Like elements in the example process and the alternative example process flow are commonly referred to with like reference numerals.

Figure 16:
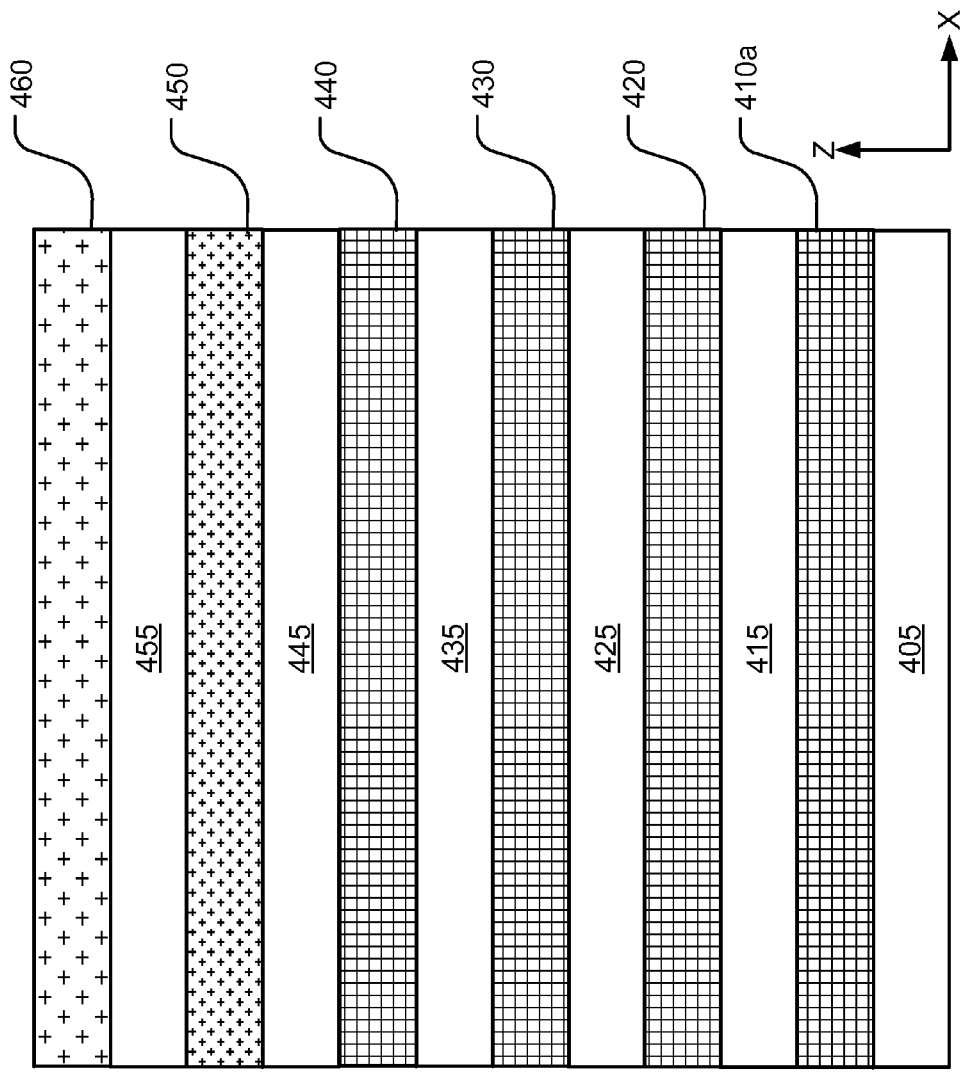
FIGS. 16 through 27 illustrate an alternative example process flow for manufacturing a memory device.

FIG. 16 illustrates a cross-section in the X-Z plane of a partially fabricated memory device. In the example shown in FIG. 16, the memory device includes a plurality of sacrificial layers (e.g. 420, 430 and 440) for forming word lines (WLs), and a sacrificial layer (e.g. 410a) for forming ground select lines (GSL), on an integrated circuit substrate. The sacrificial and conductive layers are separated by insulating layers (e.g. 405, 415, 425, 435, 445, 455). The plurality of sacrificial layers for WLs and the sacrificial layer for ground select lines (GSL) can include silicon nitride. The hard mask (e.g. 460), and the top conductive layer (e.g. 450) are as described in connection with FIG. 4.

Figure 17:
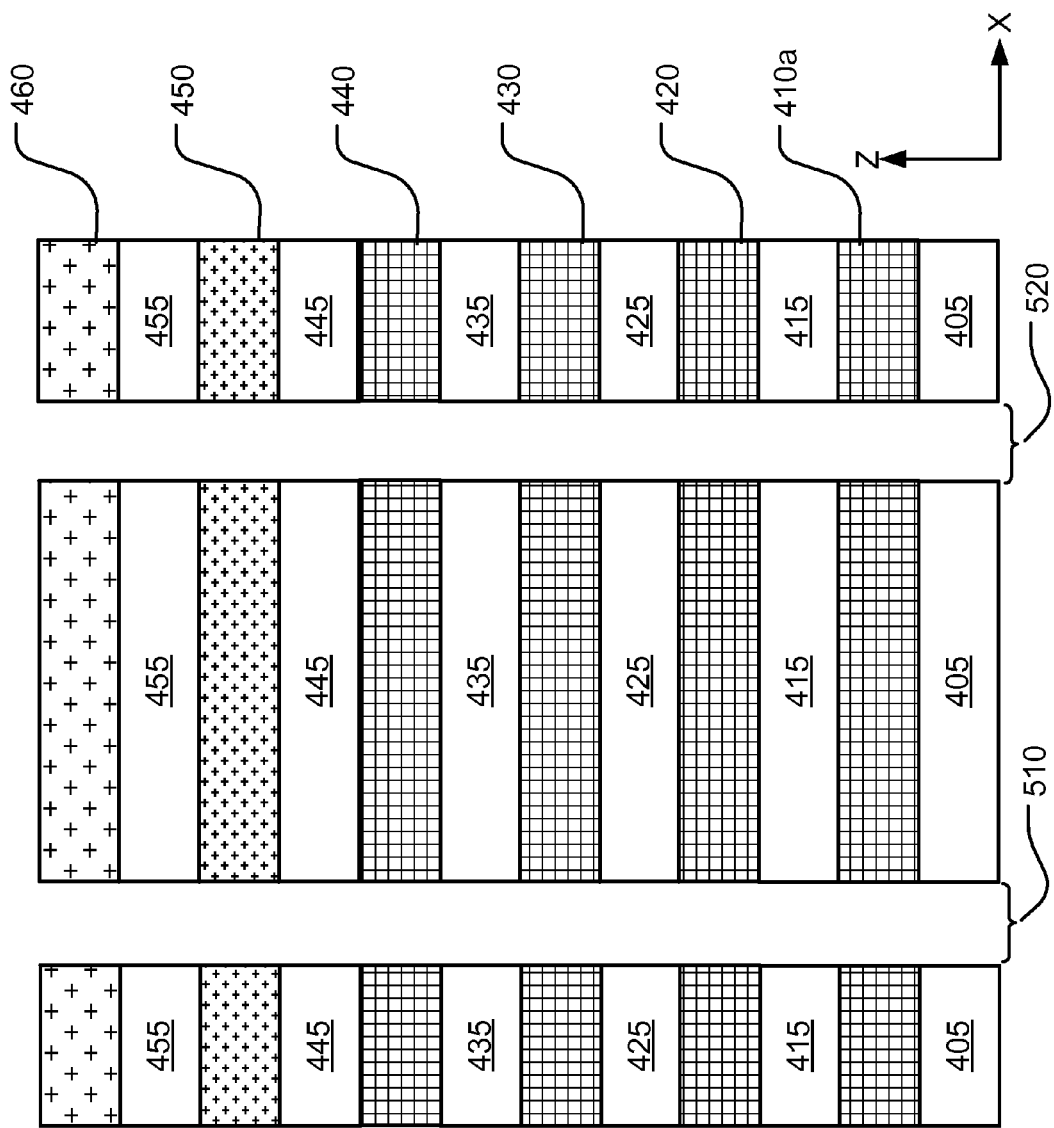

FIG. 17 illustrates a stage in the process after etching the sacrificial and conductive layers to form first openings (e.g. 510, 520). The first openings are etched through the top conductive layer (450), the plurality of sacrificial layers (e.g. 420, 430 and 440) for WLs, and the sacrificial layer for ground select lines (GSL) (e.g. 410a). The first openings are used to form a plurality of vertical active strips.

Figure 18:
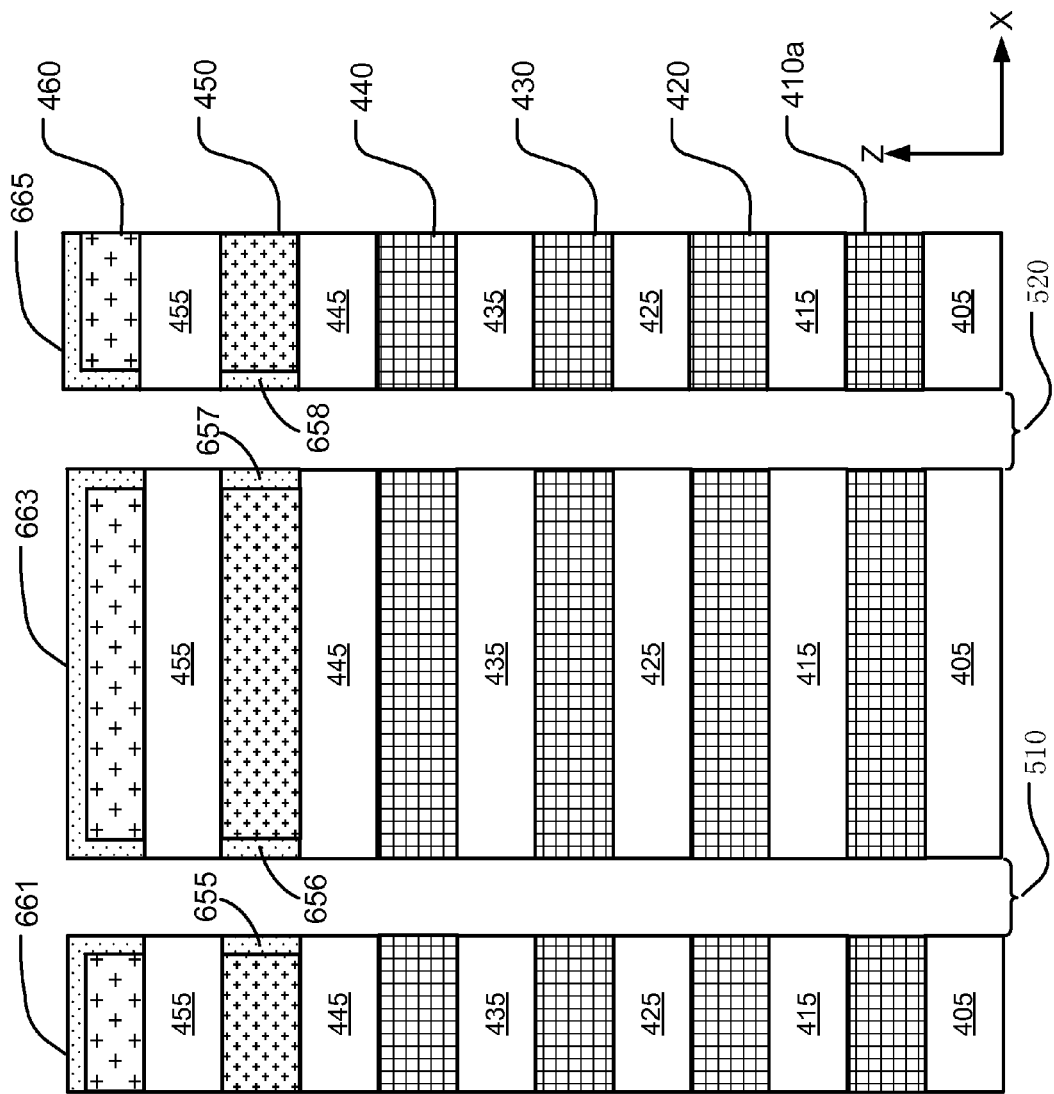

FIG. 18 illustrates a stage in the process after forming a gate dielectric layer on side surfaces of the top conductive layer (e.g. 655, 656, 657, 658) in the first openings (e.g. 510, 520). The gate dielectric layer and the forming of the gate dielectric layer using thermal oxidation are as described for FIG. 6. The thermal oxidation does not form the layer of silicon oxide material on the sacrificial layer for ground select lines (GSL) (e.g. 410a).

Figure 19:
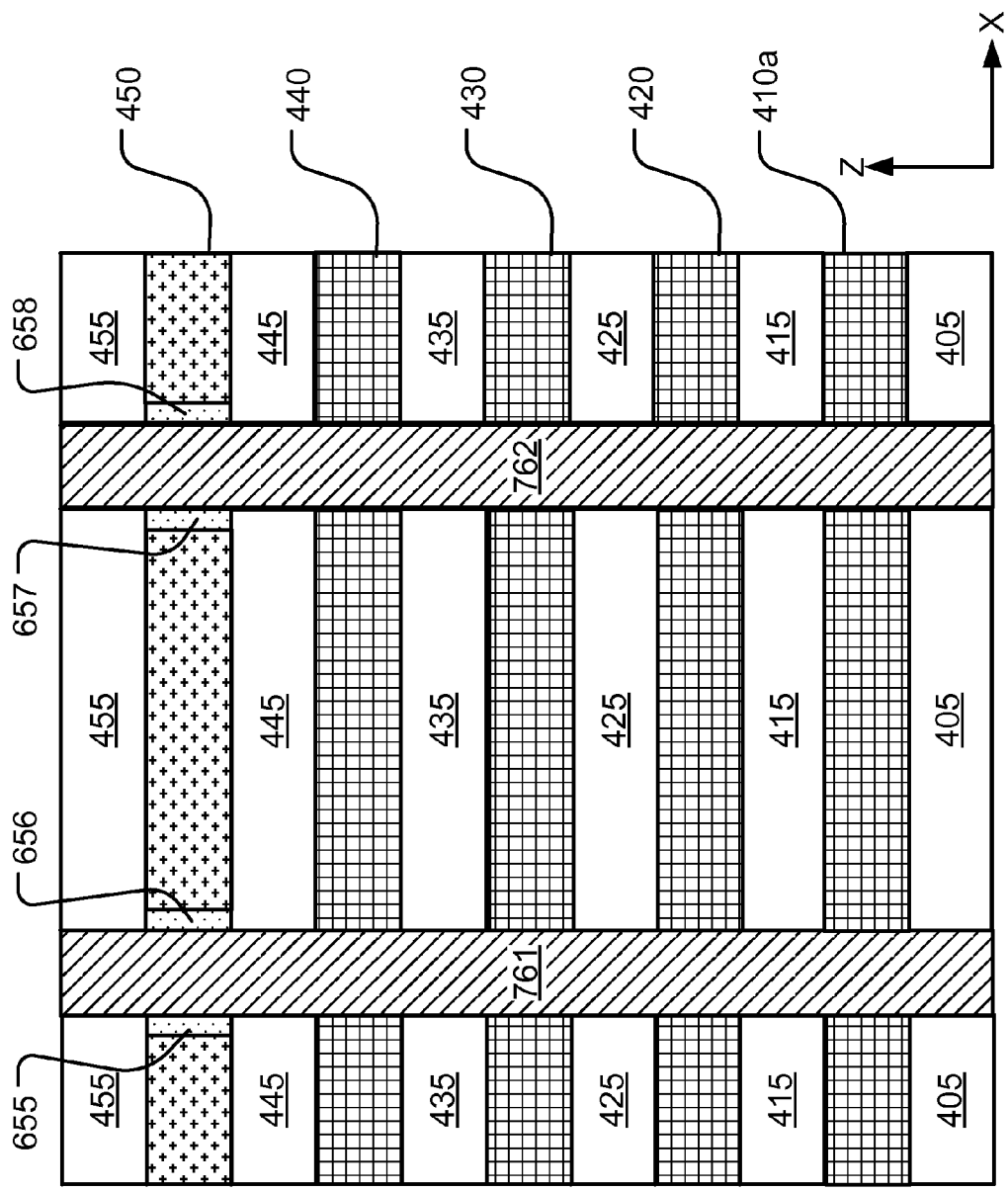

FIG. 19 illustrates a stage in the process after forming a plurality of vertical active strips (e.g. 761, 762) in the first openings. The vertical active strips contact the gate dielectric layer formed on side surfaces of the top conductive layer (e.g. 655, 656, 657, 658). The hard mask (e.g. 460) is planarized, as described for FIG. 7.

Figure 20:
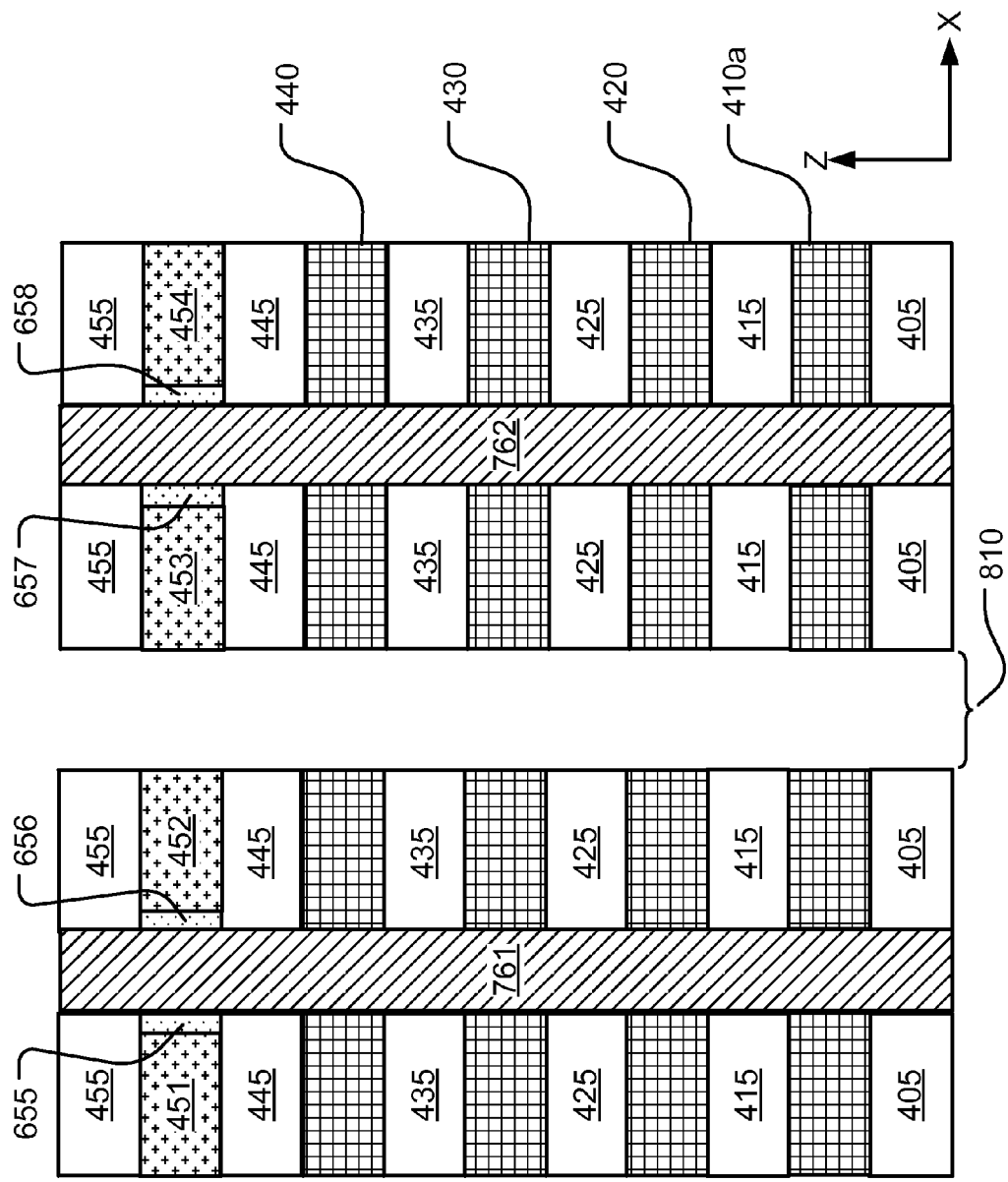

FIG. 20 illustrates a stage in the process after etching the sacrificial and conductive layers to form second openings (e.g. 810) between adjacent vertical active strips (e.g. 761, 762) in the plurality of vertical active strips. The plurality of sacrificial layers for word lines (WL) (e.g. 420, 430, 440) and the sacrificial layer for ground select lines (GSL) (e.g. 410a) are exposed by the second openings. A top plane of conductive strips (e.g. 451-454) is formed, where conductive strips in the top plane contact the gate dielectric layer (e.g. 655-658).

Figure 21:
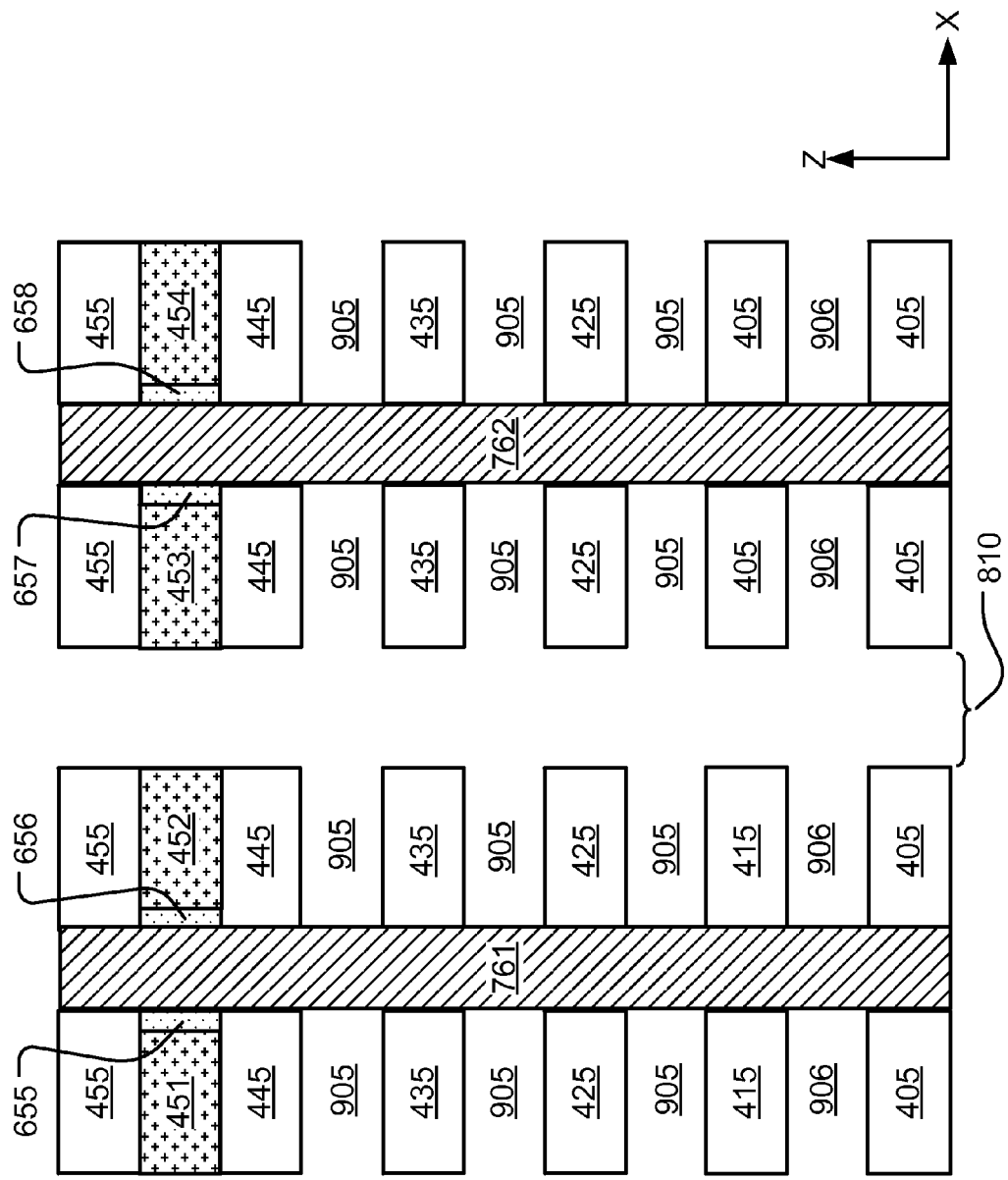

FIG. 21 illustrates a stage in the process after removing the plurality of sacrificial layers exposed by the second openings to form horizontal openings (e.g. 905) between the insulating layers (e.g. 405, 415, 425, 435, 445). This stage in the process leaves insulating layers adhered to the vertical active strips (e.g. 761, 762), with horizontal openings (e.g. 905, 906) in between. Horizontal openings 905 can be used for forming word lines (WLs), and openings 906 can be used for forming ground select lines (GSL).

Figure 22:
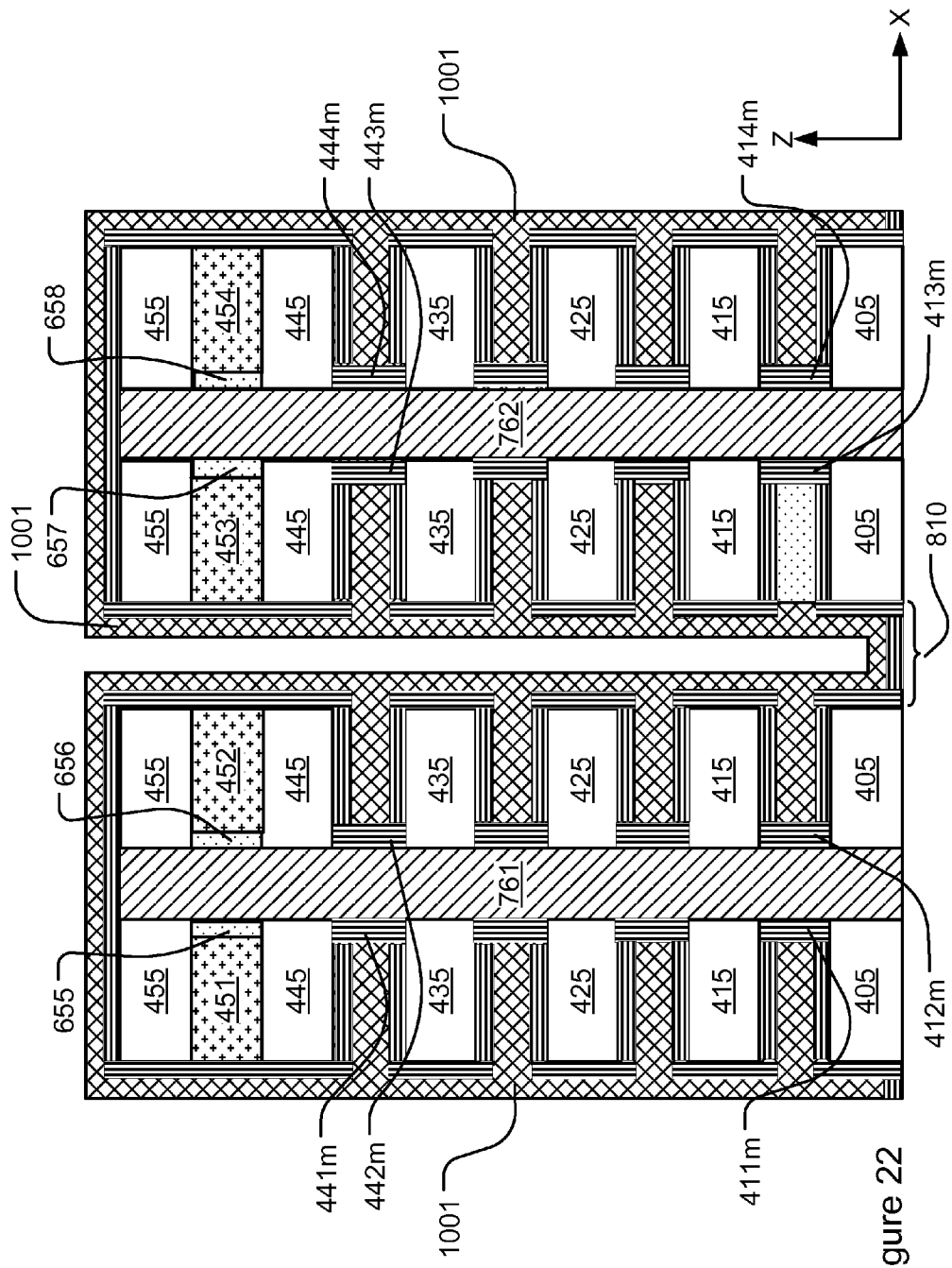

FIG. 22 illustrates a stage in the process after forming a memory layer on side surfaces of the vertical active strips in the horizontal openings for word lines (e.g. 441m, 442m, 443m, 444m) and for ground select lines (e.g. 411m, 412m, 413m, 414m), and depositing a conductive material (e.g. 1001) in the horizontal openings (e.g. 905, 906) through the second openings (e.g. 810). The conductive material can include TiN (titanium nitride) and W (tungsten). Excess conductive material may remain on walls of the second openings.

Figure 23:
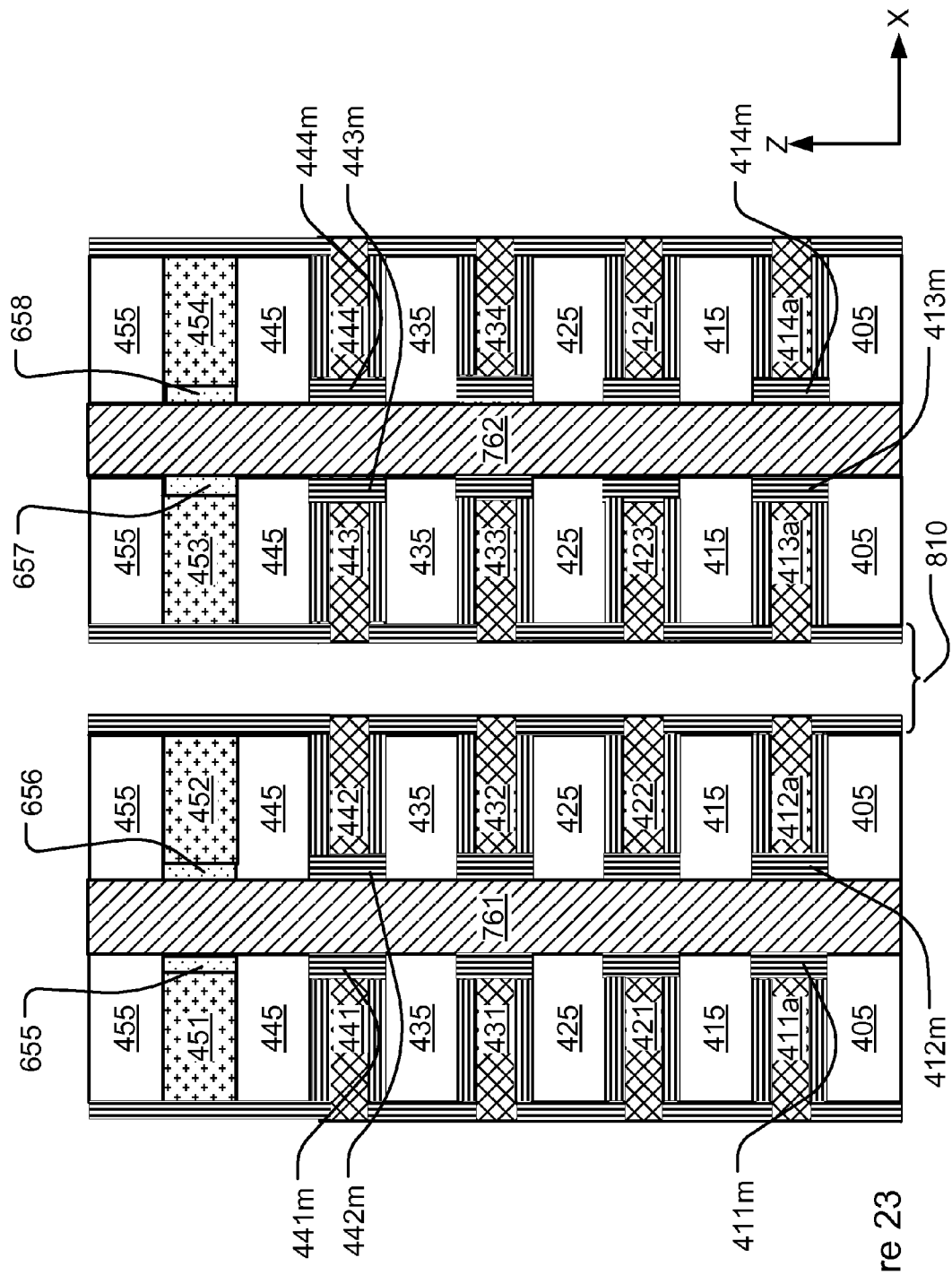

FIG. 23 illustrates a stage in the process after removing the excess conductive material remaining on the walls of the second openings, for example using an iso-tropical etch. The removal leaves the conductive material only in the horizontal openings. At this stage in the process, a plurality of planes of conductive strips is formed in the horizontal openings. The plurality of planes includes a plurality of intermediate planes (WLs) of conductive strips (e.g. 421-424, 431-434, 441-444), and a bottom plane (GSL) of conductive strips (e.g. 411a-414a). Side surfaces of conductive strips in the intermediate planes and in the bottom plane contact the memory layer (e.g. 441m-444m, 411m-414m).

Figure 24:
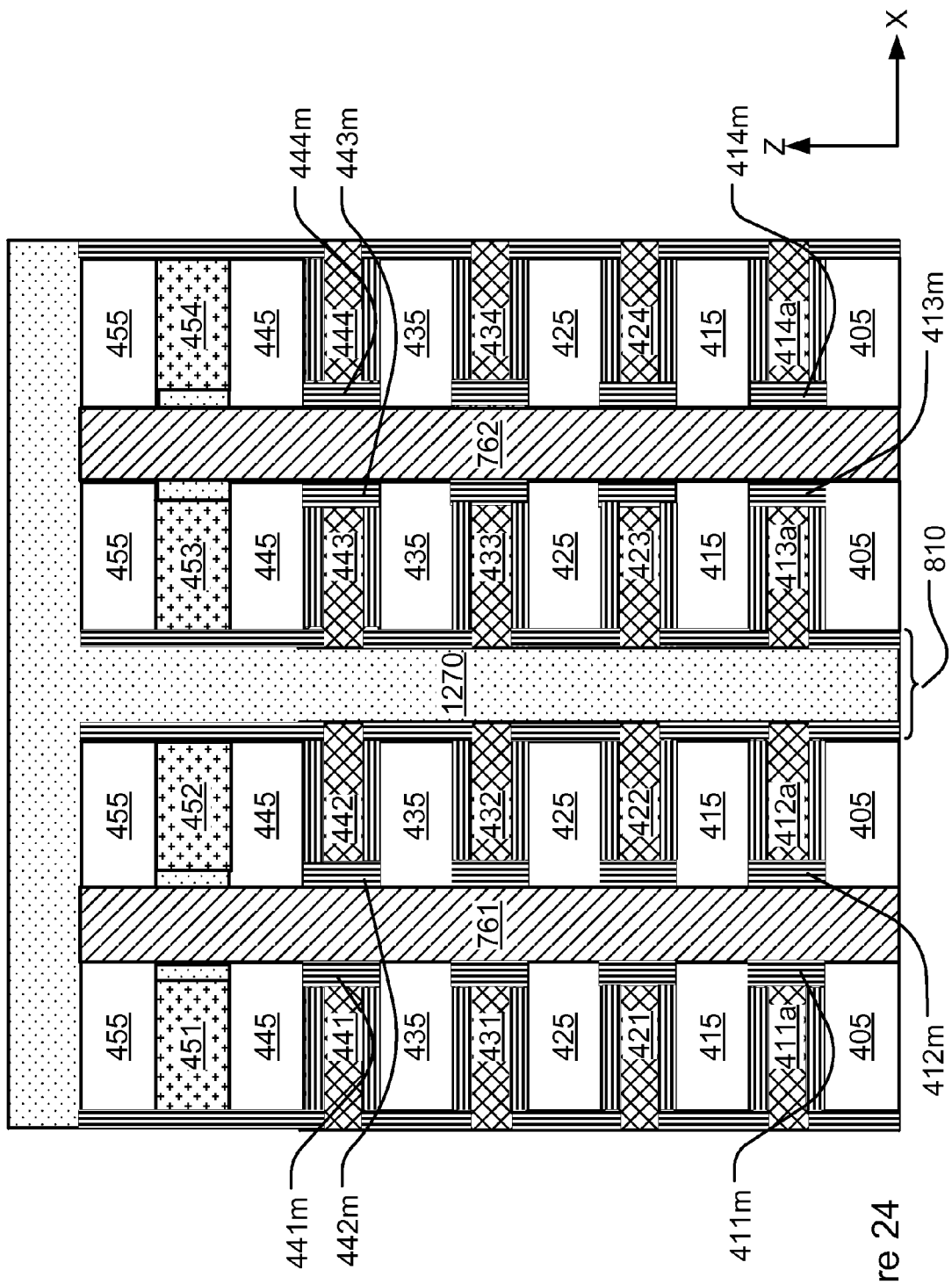

FIG. 24 illustrates a stage in the process after forming insulating material (e.g. 1270) in the second openings (e.g. 810) and over a top insulating layer (e.g. 455).

Figure 25:
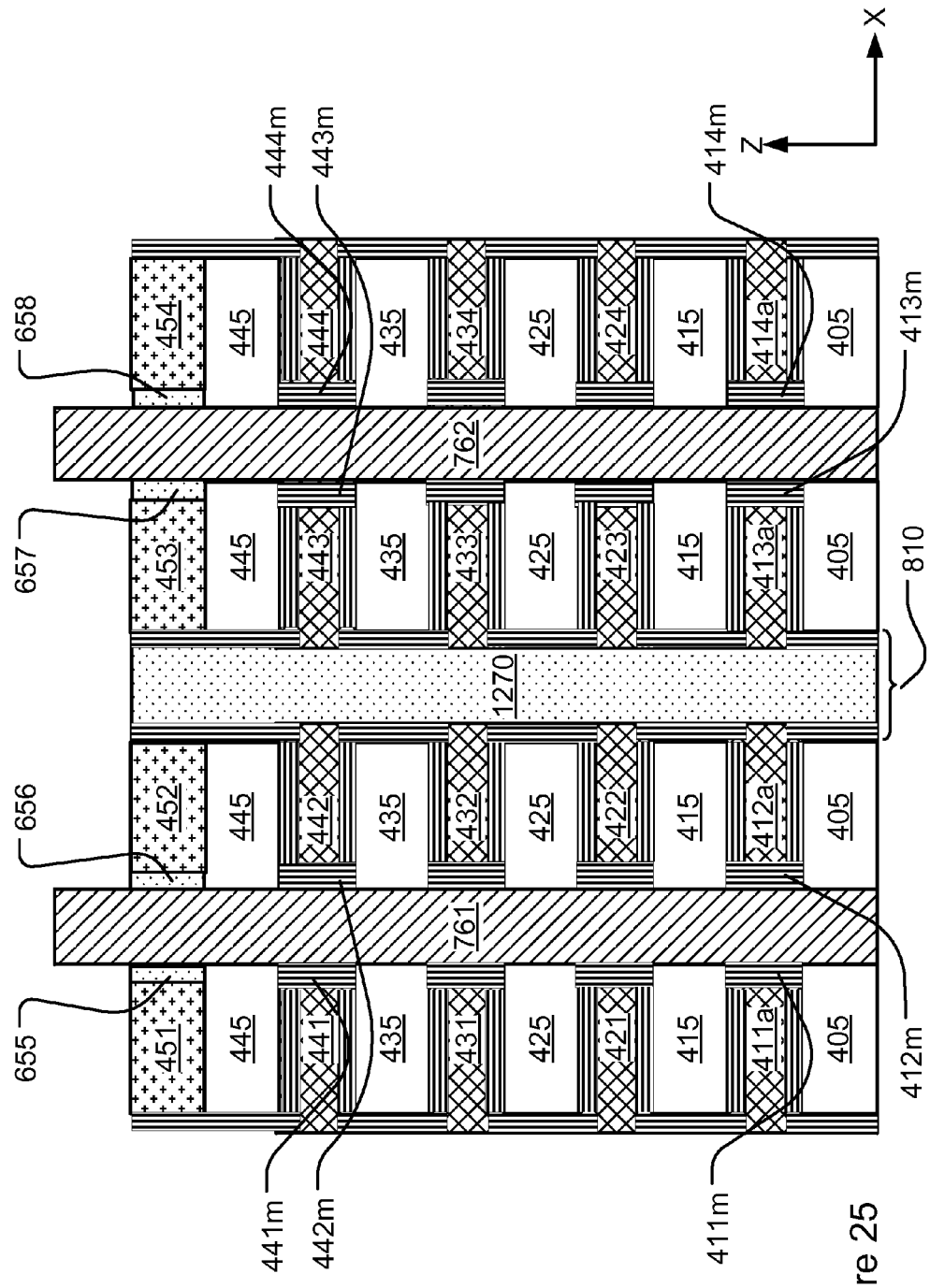

FIG. 25 illustrates a stage in the process after etching insulating materials (e.g. 1270, 455) to stop on the top plane of conductive strips (e.g. 451-454), and on top of the vertical active strips (e.g. 761, 762). At this stage in the process, a plurality of stacks of conductive strips is formed. Each stack of conductive strips includes a bottom plane (GSL) of conductive strips (e.g. 411a, 412a, 413a, 414a), a plurality of intermediate planes (WLs) of conductive strips (e.g. 441, 442, 443, 444), and a top plane (SSL) of conductive strips (e.g. 451, 452, 453, 454). Gate dielectric (e.g. 655-658) is formed in interface regions at cross-points between the vertical active strips and side surfaces of the conductive strips in the top plane of conductive strips. A memory layer including charge storage structures (e.g. 411m, 412m 413m, 414m) is formed in interface regions at cross-points between the vertical active strips and side surfaces of the conductive strips in the bottom plane.

Figure 26:
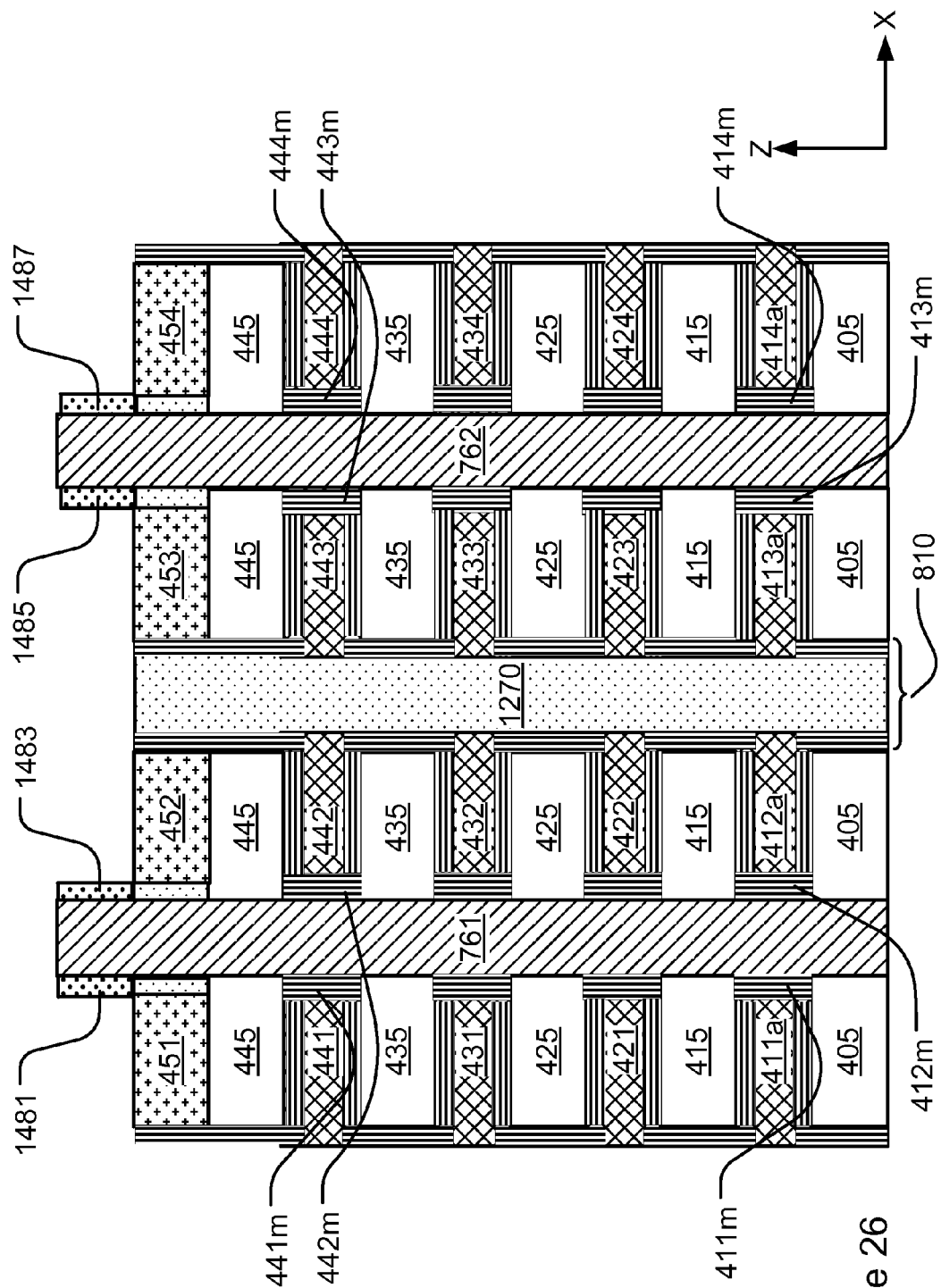

FIG. 26 illustrates a stage in the process after forming spacers (e.g. 1481, 1483, 1485, 1587) to isolate the vertical active strips (e.g. 761, 762) from the top plane of conductive strips (e.g. 451-454). The spacers can be thin dielectric liners and can include oxide or silicon nitride materials.

Figure 27:
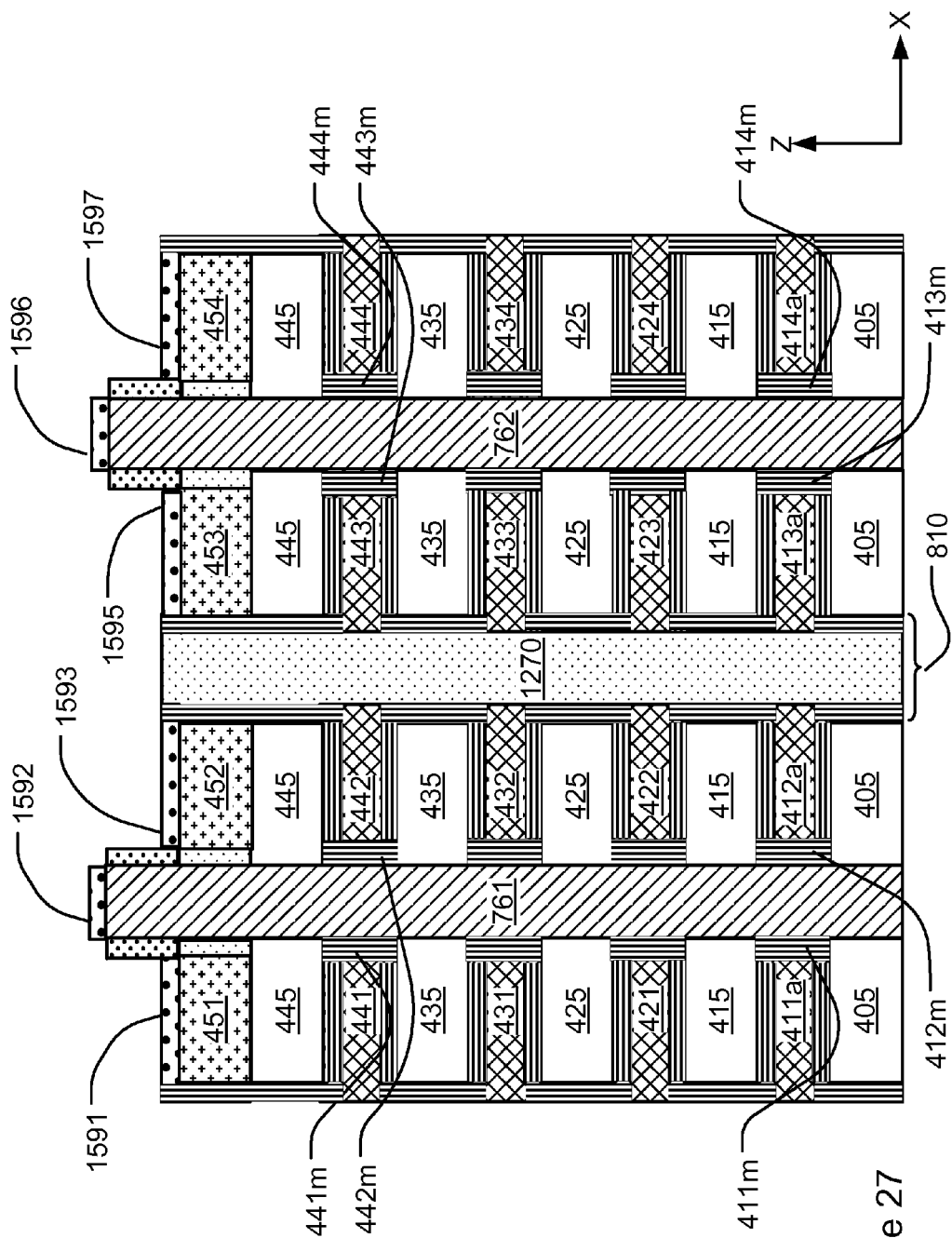

FIG. 27 illustrates a stage in the process after forming silicide formations (e.g. 1591, 1593, 1595, 1597) on the top plane of conductive strips (e.g. 451-454), and/or forming silicide formations (e.g. 1592, 1596) on top of the vertical active strips (e.g. 761, 762). The silicide formations can include Ti (titanium), Co (cobalt) and Ni (nickel). The manufacturing process continues to complete a 3D memory array.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device including an array of strings of memory cells, comprising:
    a plurality of stacks of conductive strips separated by insulating material, including at least a bottom plane of conductive strips, a plurality of intermediate planes of conductive strips, and a top plane of conductive strips;
    a plurality of vertical active strips between the plurality of stacks;
    charge storage structures in interface regions at cross-points between side surfaces of the conductive strips in the plurality of intermediate planes in the stacks and the vertical active strips in the plurality of vertical active strips; and
    gate dielectric, having a different composition than the charge storage structures, in interface regions at cross-points between and contacting the vertical active strips in the plurality of vertical active strips and side surfaces of the conductive strips in the top plane of conductive strips,
    wherein the insulating material separating conductive strips in the stacks of conductive strips contacts vertical active strips in the plurality of vertical active strips, and
    wherein conductive strips in at least one of the bottom plane and the top plane have different material than conductive strips in the plurality of intermediate planes.

2. The memory device of claim 1, comprising silicide formations on top of and in contact with the top plane of conductive strips.

3. The memory device of claim 1, comprising spacers to isolate the vertical active strips from silicide formations on top of and in contact with the top plane of conductive strips, and silicide formations on top of the vertical active strips.

4. The memory device of claim 1, wherein the gate dielectric comprises a layer of silicon oxide material and is thinner than the charge storage structures.

5. The memory device of claim 1, wherein a reference conductor is disposed in a level between the bottom plane of conductive strips and an integrated circuit substrate, and connected to the plurality of vertical active strips.

6. The memory device of claim 5, wherein the reference conductor includes N+ doped semiconductor material.

7. The memory device of claim 1, further including charge storage structures between conductive strips within a stack in the stacks of conductive strips and insulating material separating the conductive strips.

8. The memory device of claim 7, wherein said charge storage structures between conductive strips in the stacks of conductive strips and insulating material separating the conductive strips are in contact with said charge storage structures in interface regions at cross-points between side surfaces of the conductive strips in the plurality of intermediate planes in the stacks and the vertical active strips in the plurality of vertical active strips.

9. The memory device of claim 1, further comprising:
    said gate dielectric, having a different composition than the charge storage structures, in interface regions at cross-points between the vertical active strips in the plurality of vertical active strips and side surfaces of the conductive strips in both the top plane of conductive strips and the bottom plane of conductive strips.

10. The memory device of claim 1, wherein the charge storage structures are separated from the gate dielectric.

11. The memory device of claim 1, wherein the gate dielectric is an oxide of the material of the conductive strips in the bottom plane and in the top plane.

12. A memory device including an array of strings of memory cells, comprising:
    a plurality of stacks of conductive strips separated by insulating material, including at least a bottom plane of conductive strips, a plurality of intermediate planes of conductive strips, and a top plane of conductive strips;
    a plurality of vertical active strips between the plurality of stacks;
    charge storage structures in interface regions at cross-points between side surfaces of the conductive strips in the plurality of intermediate planes in the stacks and the vertical active strips in the plurality of vertical active strips; and
    gate dielectric, having a different composition than the charge storage structures, in interface regions at cross-points between and contacting the vertical active strips in the plurality of vertical active strips and side surfaces of the conductive strips in both the top plane of conductive strips and the bottom plane of conductive strips, wherein conductive strips in at least one of the bottom plane and the top plane have different material than conductive strips in the plurality of intermediate planes.

13. The memory device of claim 12, wherein the gate dielectric is an oxide of the material of the conductive strips in the bottom plane and in the top plane.

\* \* \* \* \*